US012757439B2

(12) United States Patent
Guler et al.

(10) Patent No.: US 12,757,439 B2

(45) Date of Patent: Oct. 6, 2026

(54) CONDUCTIVE BRIDGE THROUGH DIELECTRIC WALL BETWEEN SOURCE OR DRAIN CONTACTS

(71) Applicant: Intel Corporation, Santa Clara, CA (US)

(72) Inventors: Leonard P. Guler, Hillsboro, OR (US); Shengsi Liu, Portland, OR (US); Saurabh Acharya, Hillsboro, OR (US); Baofu Zhu, Portland, OR (US); Meenakshisundaram Ramanathan, Hillsboro, OR (US); Charles H. Wallace, Portland, OR (US); Ankit Kirit Lakhani, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/136,991

(22) Filed: Apr. 20, 2023

(65) Prior Publication Data

US 2024/0355890 A1 Oct. 24, 2024

(51) Int. Cl.

| | |
|---|---|
| ***H10B 10/00*** | (2023.01) |
| ***H10D 30/47*** | (2025.01) |
| ***H10D 30/67*** | (2025.01) |
| ***H10D 62/10*** | (2025.01) |
| ***H10D 84/85*** | (2025.01) |

(52) U.S. Cl.

CPC ......... *H10D 30/6729* (2025.01); *H10D 30/47* (2025.01); *H10D 30/6735* (2025.01); *H10D 30/6757* (2025.01); *H10D 62/118* (2025.01); *H10D 84/85* (2025.01)

(58) Field of Classification Search

CPC ............... H10D 30/6729; H10D 30/47; H10D 30/6735; H10D 30/6757; H10D 62/118; H10D 84/85; H10D 62/116; H10D 62/121; H10D 84/0149; H10D 84/038; H10D 84/83; H10W 20/20

USPC ........................................................ 257/288

See application file for complete search history.

(56) References Cited

U.S. PATENT DOCUMENTS

| | | | | |
|---|---|---|---|---|
| 9,349,860 | B1 * | 5/2016 | Afzalian | H10D 62/235 |
| 2007/0034955 | A1 * | 2/2007 | Kim | H10B 69/00 438/257 |
| 2017/0269481 | A1 * | 9/2017 | Borodovsky | G03F 7/2037 |

(Continued)

*Primary Examiner* — Sheikh Maruf

(74) *Attorney, Agent, or Firm* — Schwabe, Williamson & Wyatt, P.C.

(57) ABSTRACT

Techniques are provided herein to form semiconductor devices that include a conductive bridge between topside contacts on adjacent source or drain regions. The conductive bridge extends through a dielectric wall that separates the adjacent source or drain regions. In an example, a first semiconductor device includes a first gate structure around or otherwise on a first semiconductor region (or channel region) that extends from a first source or drain region, and a second adjacent semiconductor device includes a second gate structure around or otherwise on a second semiconductor region that extends from a second source or drain region. A conductive bridge connects a first conductive contact on a top surface of the first source or drain region with a second conductive contact on a top surface of the adjacent second source or drain region through a dielectric wall that otherwise separates the conductive contacts.

20 Claims, 22 Drawing Sheets

(56) References Cited

U.S. PATENT DOCUMENTS

| | | | | |
|---|---|---|---|---|
| 2019/0097147 | A1* | 3/2019 | Lu | H10K 10/491 |
| 2020/0105613 | A1* | 4/2020 | Hung | H10D 64/017 |
| 2020/0105871 | A1* | 4/2020 | Glass | H10D 62/121 |
| 2020/0266060 | A1* | 8/2020 | Cheng | H10D 64/017 |
| 2021/0183707 | A1* | 6/2021 | Ng | H10D 84/85 |
| 2021/0226066 | A1* | 7/2021 | Young | H10D 30/6713 |
| 2022/0052181 | A1* | 2/2022 | Lin | H10D 64/018 |
| 2022/0320089 | A1* | 10/2022 | Chu | H10D 84/0181 |
| 2022/0367321 | A1* | 11/2022 | Jeon | H10W 20/20 |
| 2023/0335645 | A1* | 10/2023 | You | H10D 30/014 |

* cited by examiner

CONDUCTIVE BRIDGE THROUGH DIELECTRIC WALL BETWEEN SOURCE OR DRAIN CONTACTS

FIELD OF THE DISCLOSURE

The present disclosure relates to integrated circuits, and more particularly, to contacts for source or drain regions.

BACKGROUND

As integrated circuits continue to scale downward in size, a number of challenges arise. For instance, reducing the size of memory and logic cells is becoming increasingly more difficult, as is reducing device spacing at the device layer. As transistors are packed more densely, the formation of certain interconnect features can be challenging given the limited spacing and number of tracks used for a given interconnect layer. Accordingly, there remain a number of non-trivial challenges with respect to forming semiconductor devices.

Figure 1A:
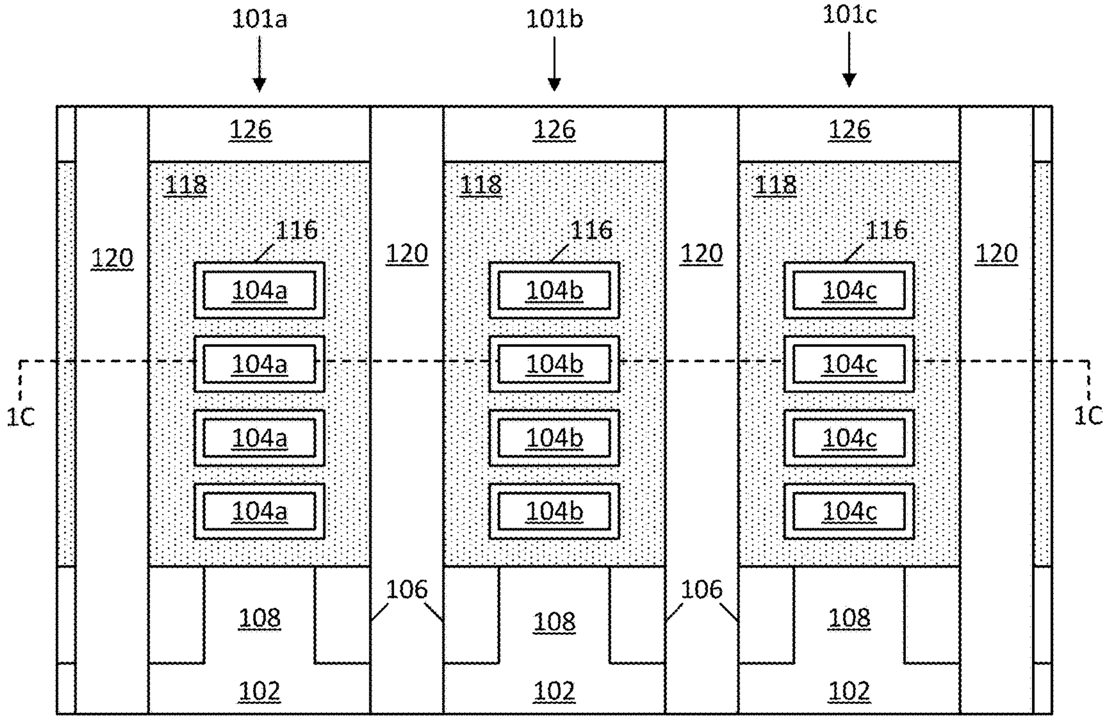
FIGS. 1A and 1B are cross-sectional views of some semiconductor devices that include a conductive bridge between source or drain contacts, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles (e.g., some features may have tapered sidewalls and/or rounded corners), and some features may have surface topology or otherwise be non-smooth, given real world limitations of the processing equipment and techniques used.

DETAILED DESCRIPTION

Techniques are provided herein to form semiconductor devices that include a conductive bridge between topside contacts on adjacent source or drain regions. The conductive bridge extends through a dielectric wall that separates the adjacent source or drain regions and the dielectric wall further extends through an entire thickness of a gate electrode to separate the gate electrode between adjacent semiconductor devices. In an example, a portion of the dielectric wall that separates the adjacent source or drain regions is recessed to allow for the through-passage of the conductive bridge. The techniques can be used in any number of integrated circuit applications and are particularly useful with respect to device layer transistors, such as finFETs or gate-all-around transistors (e.g., ribbonFETs and nanowire FETs). In an example, a first semiconductor device includes a first gate structure around or otherwise on a first semiconductor region (or channel region) that extends from a first source or drain region, and a second adjacent semiconductor device includes a second gate structure around or otherwise on a second semiconductor region that extends from a second source or drain region. The semiconductor regions can be, for example, fins of semiconductor material that extend from corresponding source or drain regions, or one or more nanowires or nanoribbons or nanosheets of semiconductor material that extend from the corresponding source or drain regions (more generally, diffusion regions). A first conductive contact on a top surface of the first source or drain region may be separated from a second conductive contact on a top surface of the adjacent second source or drain region by a dielectric wall that extends in the same direction as the length of the semiconductor regions to also separate the first gate structure from the second gate structure. A conductive bridge extends across the dielectric wall to contact both the first conductive contact and the second conductive contact. In some examples, the conductive bridge, the first conductive contact, and the second conductive contact collectively form a continuous and monolithic body of metal or other conductive material; in other examples, the conductive bridge may be provided by a first deposition process, and the first and second conductive contacts may be provided by a second deposition process, such that detectable seams or grain boundaries may exist between the conductive bridge and each of the first and second conductive contacts. Numerous variations and embodiments will be apparent in light of this disclosure.

General Overview

As previously noted above, there remain a number of non-trivial challenges with respect to integrated circuit fabrication. In more detail, as devices become smaller and more densely packed, many structures become more challenging to fabricate as critical dimensions (CD) of the structures push the limits of current fabrication technology. Interconnect structures can be particularly challenging with the number of connections to be made and a limited footprint. For many advanced libraries and certain cell designs, a limited number of signal tracks may be used in a given frontside interconnect layer (e.g., a first metal layer of a multilayer interconnect structure). In such architectures, it can be challenging to make connections between each of the various transistor elements of the underlying device layer to a limited number of signal tracks through one or more interconnect layers of the frontside interconnect structure. Accordingly, techniques are described herein to make connections between structures in the device layer below the interconnect layers of a given frontside interconnect structure, in order to free up space for other connections in the interconnect layers. Similar techniques can be used with respect to making connections between structures in the device layer above the interconnect layers of a given backside interconnect structure.

Thus, and in accordance with an embodiment of the present disclosure, an integrated circuit is disclosed that includes one or more conductive bridges between adjacent source or drain contacts within the device layer. The one or more conductive bridges may include the same or similar conductive material compared to the contacts and may extend through a dielectric wall to contact the adjacent source or drain contacts. In some embodiments, the dielectric wall extends between the adjacent source or drain regions and also extends between corresponding gate structures of the adjacent devices. The dielectric wall may extend vertically through an entire thickness of the gate structures and along an entire thickness of the source or drain regions. In some embodiments, dielectric walls may be used to separate all adjacent semiconductor devices along a given direction. The top surface of the conductive bridge may be substantially coplanar (e.g. within 2 nm variation) with a top surface of the adjacent source or drain contacts. This places the conductive bridges within the device layer and frees up additional space in the interconnect structure above the source or drain regions for other interconnections, according to some embodiments. In some such examples, a portion of the dielectric wall that separates the adjacent source or drain regions is recessed to allow for the through-passage of the conductive bridge, and to further allow for the coplanarity between the bridge and contacts.

According to an embodiment, an integrated circuit includes a first semiconductor region extending in a first direction from a first source or drain region, a second semiconductor region extending in the first direction from a second source or drain region with the second source or drain region spaced from the first source or drain region in a second direction different from the first direction, a first gate electrode around the first semiconductor region and a second gate electrode around the second semiconductor region, a dielectric wall between the first semiconductor region and the second semiconductor region and extending in the first direction such that the dielectric wall extends between the first gate electrode and the second gate electrode and the dielectric wall extends between the first source or drain region and the second source or drain region, a first contact on a top surface of the first source or drain region and a second contact on a top surface of the second source or drain region, and a conductive bridge between the first contact and the second contact. The conductive bridge extends through a portion of the dielectric wall to contact sides of the first contact and the second contact. In some such cases, the conductive bridge extends over a recessed portion of the dielectric wall to contact sides of the first contact and the second contact.

According to another embodiment, an integrated circuit includes a first semiconductor region extending in a first direction from a first source or drain region, a second semiconductor region extending in the first direction from a second source or drain region with the second source or drain region spaced from the first source or drain region in a second direction different from the first direction, a first gate electrode around the first semiconductor region and a second gate electrode around the second semiconductor region, a dielectric wall between the first semiconductor region and the second semiconductor region and extending in the first direction such that the dielectric wall extends between an entire thickness of the first gate electrode and the second gate electrode and extends between an entire thickness of the first source or drain region and the second source or drain region, and a conductive contact over a top surface of the first source or drain region and the second source or drain region. A portion of the conductive contact extends through a portion of the dielectric wall in the second direction. In some such cases, the conductive bridge extends over a recessed portion of the dielectric wall to contact sides of the first contact and the second contact.

According to another embodiment, a method of forming an integrated circuit includes forming a first fin comprising first semiconductor material and a second fin comprising second semiconductor material, the first and second fins extending above a substrate and each extending in a first direction; forming a gate electrode extending over the first fin and the second fin in a second direction different from the first direction; forming a first source or drain region at a first end of the first fin; forming a second source or drain region at a first end of the second fin; forming a contact over the first source or drain region and the second source or drain region; forming a recess through the gate electrode between the first fin and the second fin, the recess further extending in the first direction between the first source or drain region and the second source or drain region, wherein the recess splits the contact into a first contact and a second contact; forming a dielectric material within the recess; recessing a portion of the dielectric material between the first contact and the second contact; and forming a conductive material over the dielectric material, the conductive material being within the recess and contacting both the first contact and the second contact. In some such cases, a detectable seam may exist between the conductive material and each of the first and second contacts. In another example, the first and second contacts are formed in the same deposition process used to form the conductive material over the dielectric material, thus forming a continuous and monolithic conductive body (no seams between the contacts and conductive material).

The techniques can be used with any type of non-planar transistors, including finFETs (sometimes called tri-gate transistors), nanowire and nanoribbon transistors (sometimes called gate-all-around transistors), or forksheet transistors, to name a few examples. The source and drain regions can be, for example, doped portions of a given fin or substrate, or epitaxial regions that are deposited during an etch-and-replace source/drain forming process. The dopant-type in the source and drain regions will depend on the polarity of the corresponding transistor. The gate structure can be implemented with a gate-first process or a gate-last process (sometimes called a replacement metal gate, or RMG, process). Any number of semiconductor materials can be used in forming the transistors, such as group IV materials (e.g., silicon, germanium, silicon germanium) or group III-V materials (e.g., gallium arsenide, indium gallium arsenide).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate the presence of conductive contacts on adjacent source or drain regions that include a conductive bridge extending laterally between the conductive contacts and on the same plane as the conductive contacts (e.g., coplanar top surfaces). In some embodiments, the conductive bridge extends through a dielectric wall, which separates the adjacent source or drain regions from one another and also extends between adjacent gate electrodes of the adjacent devices. The height of the dielectric wall may be shorter where the conductive bridge passes therethrough, relative to other portions of the dielectric wall, such as the portion of the dielectric wall that passes between adjacent gate structures of neighboring transistors. Likewise, the height of the dielectric wall may be shorter where the conductive bridge passes therethrough, relative to other dielectric walls that the conductive bridge is laterally between.

It should be readily understood that the meaning of "above" and "over" in the present disclosure should be interpreted in the broadest manner such that "above" and "over" not only mean "directly on" something but also include the meaning of over something with an intermediate feature or a layer therebetween. Further, spatially relative terms, such as "beneath," "below," "lower," "above," "upper," "top," "bottom," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the materials has an element that is not in the other material.

Architecture

Figure 1B:
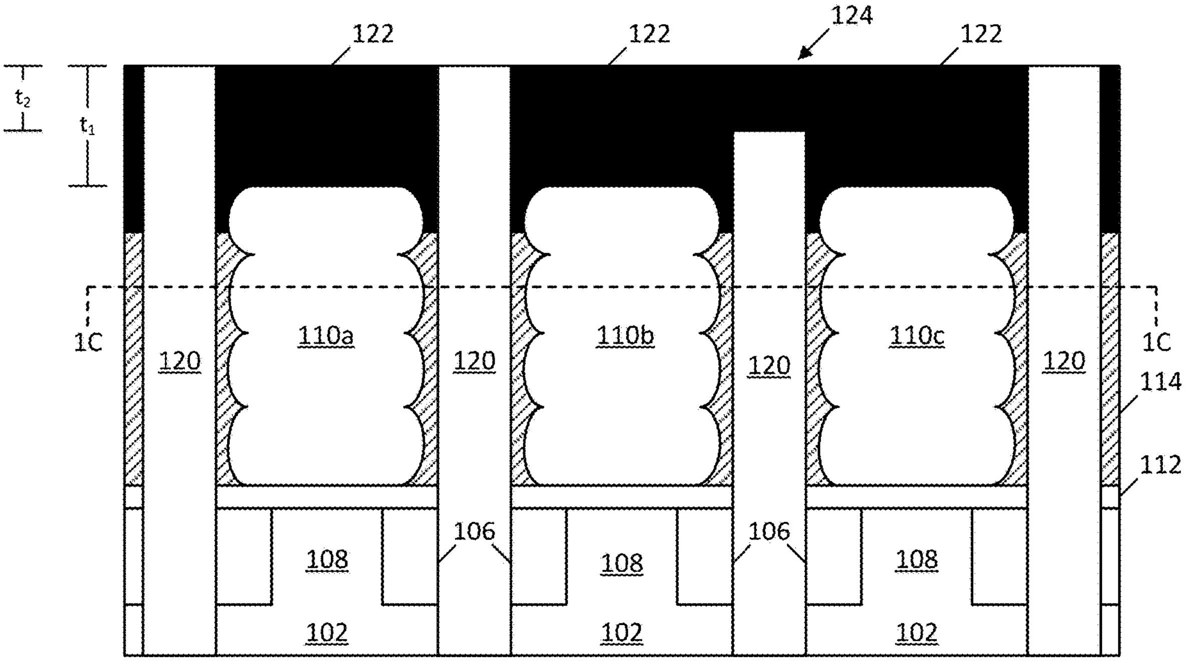
Figure 1C:
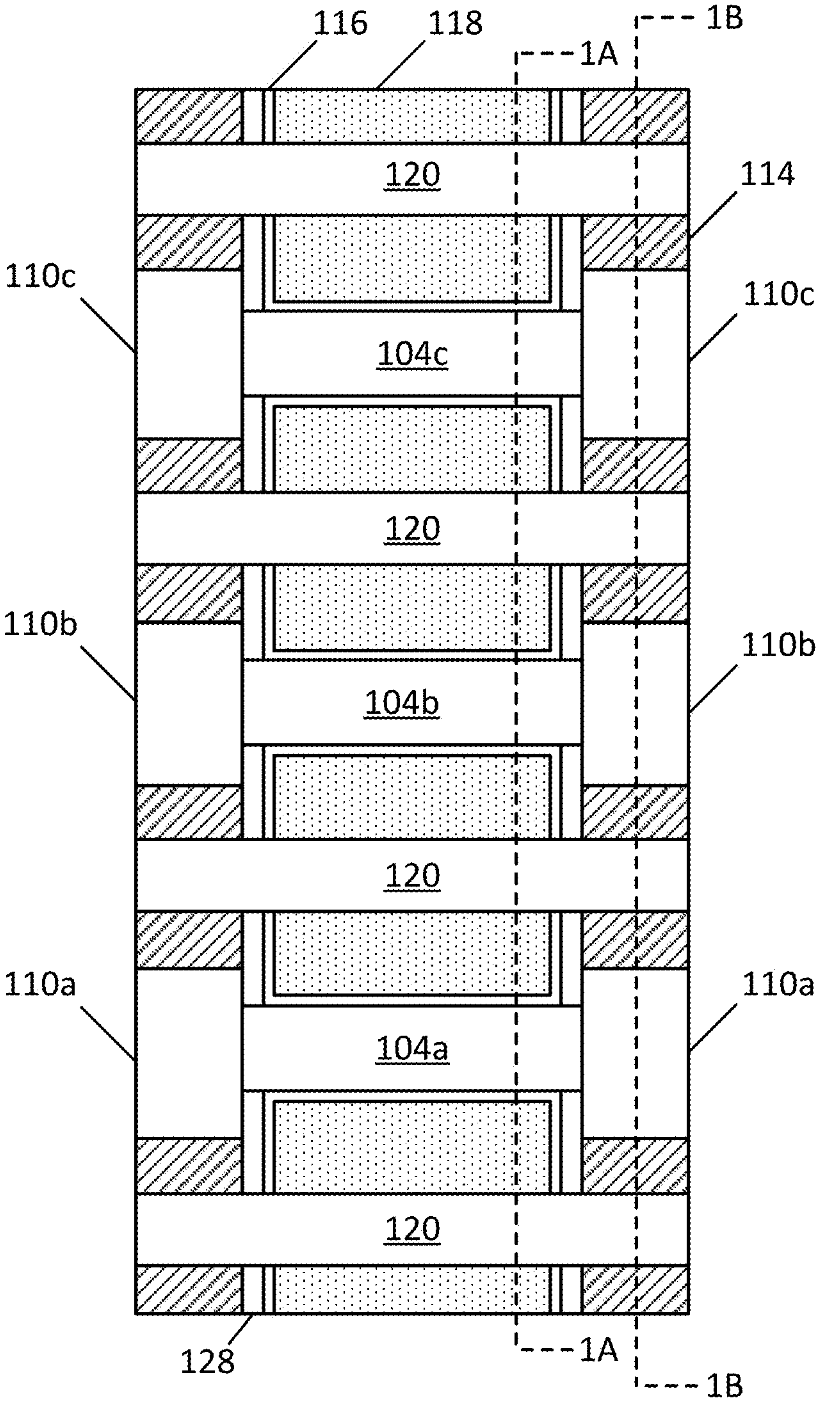
FIG. 1C is a plan view of the integrated circuit of FIGS. 1A and 1B, in accordance with an embodiment of the present disclosure.

FIG. 1A is a cross-sectional view taken across the gate trench of three example semiconductor devices, a first semiconductor device 101*a*, a second semiconductor device 101*b*, and a third semiconductor device 101*c* according to an embodiment of the present disclosure. FIG. 1B is another cross-sectional view taken across the source/drain trench or diffusion region and contact trench adjacent to the gate trench either into or out of the page of FIG. 1A. FIG. 1C is a top-down cross-section view of the adjacent semiconductor devices 101*a*-101*c* taken across the dashed line 1C-1C depicted in both FIG. 1A and FIG. 1B. FIG. 1A illustrates the cross-section taken across the dashed line 1A-1A depicted in FIG. 1C, and FIG. 1B illustrates the cross-section taken across the dashed line 1B-1B depicted in FIG. 1C.

Each of semiconductor devices 101*a*-101*c* may be, for example, non-planar metal oxide semiconductor (MOS) transistors, such as tri-gate (e.g., finFET) or gate-all-around (GAA) transistors, although other transistor topologies and types could also benefit from the techniques provided herein. The illustrated example embodiments use the GAA structure. The various illustrated semiconductor devices represent a portion of an integrated circuit that may contain any number of similar semiconductor devices.

As can be seen, semiconductor devices 101*a*-101*c* are formed on a substrate 102. Any number of semiconductor devices can be formed on substrate 102, but three are illustrated here as an example. Substrate 102 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, substrate 102 can be a semiconductor-on-insulator substrate having a desired semiconductor layer over a buried insulator layer (e.g., silicon over silicon dioxide). Alternatively, substrate 102 can be a multilayer substrate or superlattice suitable for forming nanowires or nanoribbons (e.g., alternating layers of silicon and SiGe, or alternating layers indium gallium arsenide and indium phosphide). Any number of substrates can be used. In some embodiments, a lower portion of (or all of) substrate 102 is removed and replaced with one or more backside interconnect layers to form, for example, backside signal and power routing, during a backside process. In some such cases, the techniques described herein can be similarly used to provision backside contacts to the source or drain regions and a conductive bridge therebetween.

Each of semiconductor devices 101*a*, 101*b*, and 101*c* includes one or more corresponding nanoribbons 104*a*, 104*b*, and 104*c*, respectively, that extend parallel to one another along a direction between corresponding source or drain regions, as seen more clearly in FIG. 1C (e.g., a first direction into and out of the page in the cross-section view of FIG. 1A). Accordingly, nanoribbons 104*a* extend between source or drain regions 110*a*, nanoribbons 104*b* extend between source or drain regions 110*b*, and nanoribbons 104*c* extend between source or drain regions 110*c*. Nanoribbons 104*a*-104*c* are one example of semiconductor regions or semiconductor bodies that extend between source or drain regions. The term nanoribbon may also encompass other similar shapes such as nanowires or nanosheets. The semiconductor material of nanoribbons 104*a*-104*c* may be formed from substrate 102. In some embodiments, semiconductor devices 101*a*-101*c* may each include semiconductor regions in the shape of fins that can be, for example, native to substrate 102 (formed from the substrate itself), such as silicon fins etched from a bulk silicon substrate. Alternatively, the fins can be formed of material deposited onto an underlying substrate. In one such example case, a blanket layer of silicon germanium (SiGe) can be deposited onto a silicon substrate, and then patterned and etched to form a plurality of SiGe fins extending from that substrate. In another such example, non-native fins can be formed in a so-called aspect ratio trapping based process, where native fins are etched away so as to leave fin-shaped trenches which can then be filled with an alternative semiconductor material (e.g., group IV or III-V material). In still other embodiments, the fins include alternating layers of material (e.g., alternating layers of silicon and SiGe) that facilitate forming of the illustrated nanoribbons 104*a*-104*c* during a gate forming process where one type of the alternating layers is selectively etched away so as to liberate the other type of alternating layers within the channel region, so that a gate-all-around (GAA) process can then be carried out. Again, the alternating layers can be blanket deposited and then etched into fins or deposited into fin-shaped trenches.

As can further be seen, adjacent semiconductor devices are separated by a dielectric fill 106. Dielectric fill 106 provides shallow trench isolation (STI) between any adjacent semiconductor devices. Dielectric fill 106 can be any suitable dielectric material, such as silicon dioxide, aluminum oxide, or silicon oxycarbonitride.

Semiconductor devices 101*a*-101*c* each include a subfin region 108. According to some embodiments, subfin region 108 comprises the same semiconductor material as substrate 102 and is adjacent to dielectric fill 106. According to some embodiments, nanoribbons 104*a*-104*c* (or other semiconductor bodies) extend between source or drain regions 110*a*-110*c* in the first direction to provide an active region (sometimes called channel region) for a transistor (e.g., the semiconductor region beneath the gate). It should be understood that the source or drain regions 110*a*-110*c* illustrated in the cross-section of FIG. 1B are only along one side of nanoribbons 104*a*-104*c* (e.g., out of the page of FIG. 1A) and that similar source or drain regions may be present along the opposite side of nanoribbons 104*a*-104*c*, as shown in FIG. 1C.

According to some embodiments, the source or drain regions are epitaxial regions that are provided using an etch-and-replace process. In other embodiments the source or drain regions could be, for example, implantation-doped native portions of the semiconductor fins or substrate. Any semiconductor materials suitable for source and drain regions can be used (e.g., group IV and group III-V semiconductor materials). The composition and doping of the source or drain regions may be the same or different, depending on the polarity of the transistors. In an example, for instance, one transistor is a p-type MOS (PMOS) transistor, and the other transistor is an n-type MOS (NMOS)

transistor. As such, source or drain region 110$b$ may have a different dopant type (n or p) compared to source or drain region 110$c$. Any number of source or drain configurations and materials can be used.

According to some embodiments, a lower dielectric layer 112 exists beneath source or drain regions 110$a$-110$c$. Lower dielectric layer 112 can include any suitable dielectric material, such as silicon dioxide or silicon nitride or silicon oxynitride and may be provided to isolate source or drain regions 110$a$-110$c$ from subfin regions 108. According to some embodiments, another dielectric fill 114 is provided around and over portions of source or drain regions 110$a$-110$c$ along the source/drain trench after epitaxial formation of the source/drain regions is complete. Dielectric fill 114 may be any suitable dielectric material, although in some embodiments, dielectric fill 114 includes the same dielectric material as dielectric fill 106 or lower dielectric layer 112. In one example, each of dielectric fill 114, lower dielectric layer 112, and dielectric fill 106 includes silicon dioxide.

According to some embodiments, a gate structure extends over nanoribbons 104$a$-104$c$ of semiconductor devices 101$a$-101$c$ along a second direction across the page of FIG. 1A. The gate structure includes a gate dielectric 116 and a gate electrode 118. Gate dielectric 116 represents any number of dielectric layers present between nanoribbons 104$a$-104$c$ and gate electrode 118. Gate dielectric 116 may also be present on the surfaces of other structures within the gate trench, such as on subfin regions 108. Gate dielectric 116 may include any suitable gate dielectric material(s). In some embodiments, gate dielectric 116 includes a layer of native oxide material (e.g., silicon dioxide) on the nanoribbons or other semiconductor regions making up the channel region of the devices, and a layer of high-k dielectric material (e.g., hafnium oxide) on the native oxide.

Gate electrode 118 may represent any number of conductive layers, such as any metal, metal alloy, or doped polysilicon layers. In some embodiments, gate electrode 118 includes one or more workfunction metals around nanoribbons 104$a$-104$c$. In some embodiments, one of semiconductor devices 101$a$-101$c$ is a p-channel device that includes a workfunction metal having titanium around its nanoribbons and another semiconductor device is an n-channel device that includes a workfunction metal having tungsten around its nanoribbons. Gate electrode 118 may also include a fill metal or other conductive material around the workfunction metals to provide the whole gate electrode structure.

According to some embodiments, dielectric walls 120 are present between adjacent semiconductor devices such that a first gate structure is present over nanoribbons 104$a$, a second gate structure is present over nanoribbons 104$b$, and a third gate structure is present over nanoribbons 104$c$. Dielectric walls 120 extend along the first direction (e.g., into and out of the page) across the gate trench and further along the source/drain trench to isolate adjacent source or drain regions from each other. Accordingly, dielectric walls 120 extend between source or drain region 110$a$ and source or drain region 110$b$ and also between source or drain region 110$b$ and source or drain region 110$c$. Dielectric walls 120 may continue to extend in the first direction to separate any number of other devices from one another within the integrated circuit. Dielectric walls 120 extend through at least an entire thickness of the gate structures. In some examples, dielectric walls 120 also extend through an entire thickness of dielectric fill 106. Dielectric walls 120 may be formed from a sufficiently insulating material, such as a dielectric material. Example materials for dielectric walls 120 include silicon nitride, silicon oxide, or silicon oxynitride. According to some embodiments, dielectric walls 120 each has a width between about 10 nm and about 15 nm.

According to some embodiments, any number of conductive contacts 122 may be formed on corresponding source or drain regions 110$a$ and 110$b$, respectively. According to some embodiments, each of first conductive contact 122$a$ and second conductive contact 122$b$ includes a conductive fill and a conductive liner along outside edges of the conductive fill. The conductive fill may be any suitably conductive material such as tungsten (W). Other conductive materials may include copper (Cu), ruthenium (Ru), cobalt (Co), titanium (Ti), molybdenum (Mo), or any alloys thereof. The conductive liner may be, for instance, a barrier layer and/or resistance-reducing layer that includes titanium or tantalum (e.g., titanium nitride or tantalum nitride) or some other suitable liner layer.

According to some embodiments, a conductive bridge 124 extends across a portion of dielectric wall 120 to contact both conductive contacts 122 over source or drain region 110$b$ and source or drain region 110$c$. According to some embodiments, conductive contacts 122 above the source or drain regions have a first thickness $t_1$ and conductive bridge 124 has a second thickness $t_2$. In some examples, the first thickness $t_1$ is between about 20 nm and about 50 nm and the second thickness $t_2$ is between about 5 nm and about 25 nm. More generally, the first thickness $t_1$ may be at least 4 or 5 nm greater, or two times greater, than the second thickness $t_2$, according to some embodiments. According to some embodiments, both conductive contacts 122 and conductive bridge 124 have a top surface that are substantially coplanar.

Each of conductive contacts 122 and conductive bridge 124 may include any suitable conductive material, such as tungsten, molybdenum, or other metals. According to some embodiments, conductive contacts 122 and conductive bridge 124 are formed together such that they include the same conductive material with no visible seams or grain boundary present between them, such that the respective contacts 122 and conductive bridge 124 are a continuous and monolithic body of conductive material. In some such cases, there may be one or more liner or barrier layers that are also common to the respective contacts 122 and conductive bridge 124, and the body of conductive material is on one or more of those layers. In some embodiments, the conductive material of conductive bridge 124 is different from the conductive material of conductive contacts 122. In still other embodiments, the conductive material of conductive bridge 124 is the same as the conductive material of conductive contacts 122, but is deposited at a different time so as to provide a seam or other indication of distinct depositions.

According to some embodiments, a dielectric cap layer 126 runs along a top surface of the gate structures in the gate trench. Accordingly, dielectric cap layer 126 may run along the second direction on the top surface of gate electrode 118 and be interrupted by dielectric walls 120. Dielectric cap layer 126 may include the same dielectric material as dielectric walls 120, in some examples. Note that the portion of the dielectric wall 120 extending between the source or drain regions 110$b$ and 110$c$ (as shown in FIG. 1B) has a first height, and the portion of that dielectric wall 120 extending between the gate electrodes 118 (as shown in FIG. 1A) has a second height that is taller than the first height. In one example, the first height is shorter than the second height by 4 nm or more (similar to thickness $t_2$ shown in FIG. 1B). Likewise, note that the portion of the dielectric wall 120 extending between the source or drain regions 110$b$ and 110$c$ (as shown in FIG. 1B) has a first height, and the laterally adjacent portions of the neighboring dielectric walls 120 to the left of source or drain region 110*b* and to the right of source or drain region 110*c*, respectively, each has a second height that is taller than the first height. In one such example, the first height is shorter than the second height by 4 nm or more (similar to thickness $t_2$ shown in FIG. 1B). In such an example, further note how the structure that collectively includes the contacts 122 and the conductive bridge 124 is laterally between those laterally adjacent portions of the neighboring dielectric walls 120 to the left of source or drain region 110*b* and to the right of source or drain region 110*c*. In some embodiments, the top surface of the conductive structure (122/124/122) is coplanar with top surfaces of the neighboring dielectric walls 120 (the second and fourth dielectric walls from the left side of the depicted structure in FIG. 1B).

In some embodiments, a frontside interconnect structure is formed on the top of the structure depicted in FIGS. 1A and 1B. In an example, the interconnect structure may include multiple interconnect layers, each set off from one another by a thin etch stop layer (e.g., 5 nm layer of silicon nitride). A given interconnect layer may include any number of conductive interconnect features (e.g., vias and lines) formed in a thick layer of dielectric material (e.g., 100 nm layer of silicon dioxide). The conductive features of the interconnect layers provide conductive pathways or tracks for signal routing to and from the device layer. Any number of configurations can be used. Similarly, a backside interconnect structure can be formed on the bottom of the structure depicted in FIGS. 1A and 1B to provide, for instance, power routing.

FIG. 1C illustrates the plan view of the integrated circuit showing how nanoribbons 104*a*-104*c* extend between corresponding source or drain regions 110*a*-110*c*. According to some embodiments, spacer structures 128 extend along the sides of the gate trench and isolate the gate trench from the source/drain trench (including epi or doped regions and their respective contacts). Spacer structures 128 may include any suitable dielectric material, such as silicon nitride. The nanoribbons 104*a*-104*c* (or other channel body) extend through spacer structures 128 to contact respective source or drain regions 110*a*-110*c*. Note that conductive bridge 124 and contacts 122 are not shown in this particular plan view cross-section, as the depicted cross-section is taken below those features, as indicated with dashed line 1C-1C in each of FIGS. 1A-B. The structure including conductive bridge 124 and corresponding contacts 122 could be, for instance, above and on the source or drain regions 110*b* and 110*c* on the right side of FIG. 1C, as well as above and on the corresponding dielectric fill 114 and the dielectric wall 120 between source or drain regions 110*b* and 110*c*, as well as laterally between the two corresponding outer dielectric walls 120. As described above, the structure including conductive bridge 124 and corresponding contacts 122 may be, for example, a continuous and monolithic body of conductive material, or distinct bodies of the same conductive material, or distinct bodies of different conductive materials.

Figure 1D:
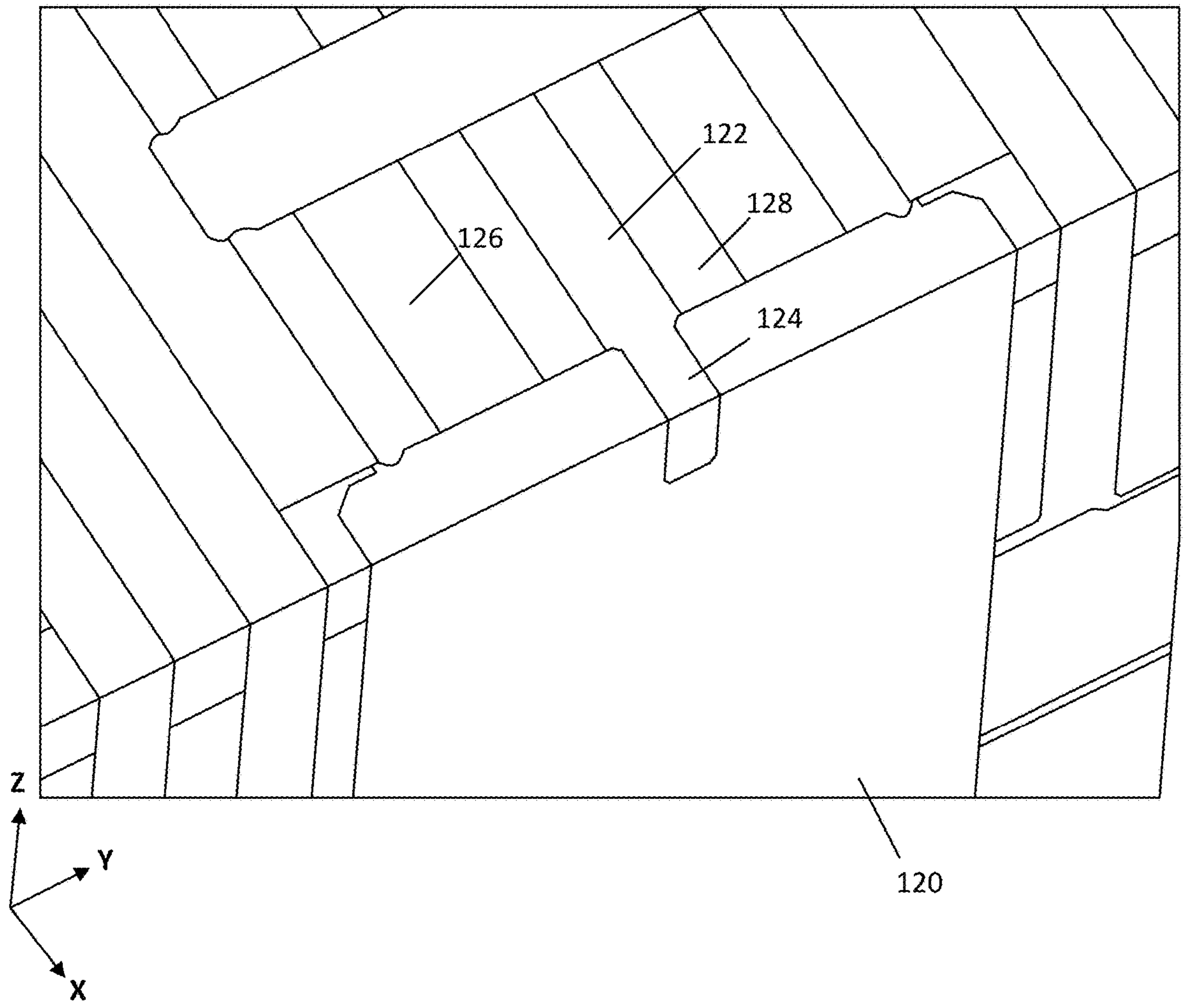
FIG. 1D is a three-dimensional view of the integrated circuit of FIGS. 1A and 1B, in accordance with an embodiment of the present disclosure.

FIG. 1D illustrates a three-dimensional view of the integrated circuit showing conductive bridge 124 extending through a portion of a dielectric wall 120. As discussed above, conductive bridge 124 may extend between a contact 122 and another contact (not shown in this view). According to some embodiments, conductive bridge 124 has substantially straight sides along the X-axis (e.g., the second direction), which may be observed from any number of conductive bridges across the integrated circuit. The straight and narrow profile of conductive bridge 124 may be caused, for example, by the fabrication processes described herein.

Fabrication Methodology

FIGS. 2A-13A and 2B-13B are cross-sectional views that collectively illustrate a first example process for forming an integrated circuit configured with a conductive bridge between source or drain contacts, in accordance with an embodiment of the present disclosure. FIGS. 2A-13A represent cross-sectional views taken across a gate trench of the integrated circuit, while FIGS. 2B-13B represent cross-sectional views taken across the source/drain trench adjacent to the gate trench along the same direction. Each figure shows an example structure that results from the process flow up to that point in time, so the depicted structure evolves as the process flow continues, culminating in the structure shown in FIGS. 13A and 13B, which is similar to the structure shown in FIGS. 1A and 1B, respectively. Such a structure may be part of an overall integrated circuit (e.g., such as a processor or memory chip) that includes, for example, digital logic cells and/or memory cells and analog mixed signal circuitry. Thus, the illustrated integrated circuit structure may be part of a larger integrated circuit that includes other integrated circuitry not depicted. Example materials and process parameters are given, but the present disclosure is not intended to be limited to any specific such materials or parameters, as will be appreciated. Figures sharing the same number (e.g., FIGS. 2A and 2B) illustrate different views of the structure at the same point in time during the process flow. Although the fabrication of a single conductive bridge is illustrated in the aforementioned figures, it should be understood that any number of similar conductive bridges can be fabricated across the integrated circuit using the same processes discussed herein.

Figure 2A:
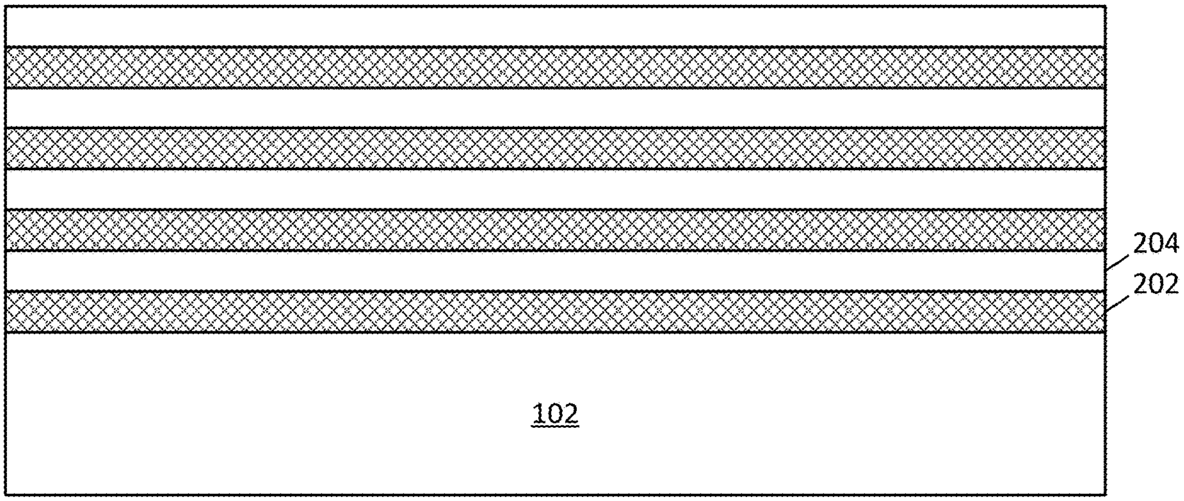
FIGS. 2A and 2B are cross-sectional views that illustrate a stage in a first example process for forming semiconductor devices that have a conductive bridge between source or drain contacts, in accordance with some embodiments of the present disclosure.
Figure 2B:
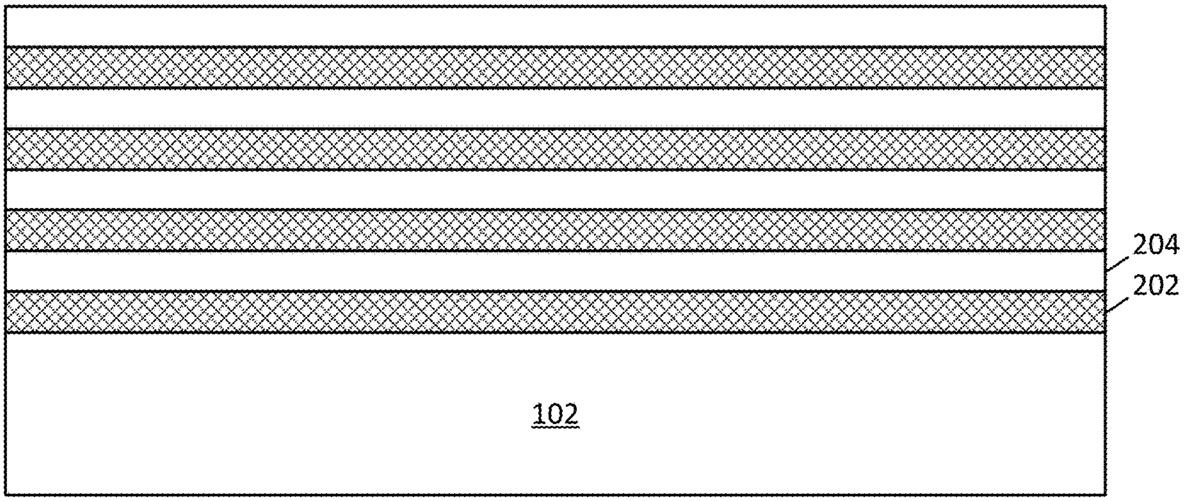

FIGS. 2A and 2B illustrate parallel cross-sectional views taken through a stack of alternating semiconductor layers on semiconductor substrate 102. FIG. 2A is taken across a portion of the stack that will eventually become a gate trench while FIG. 2B is taken across a portion of the stack that will eventually become a source/drain trench adjacent and parallel to the gate trench. Alternating material layers may be deposited over substrate 102 including sacrificial layers 202 alternating with semiconductor layers 204. The alternating layers are used to form GAA transistor structures. Any number of alternating semiconductor layers 204 and sacrificial layers 202 may be deposited over substrate 102.

According to some embodiments, sacrificial layers 202 have a different material composition than semiconductor layers 204. In some embodiments, sacrificial layers 202 are silicon germanium (SiGe) while semiconductor layers 204 include a semiconductor material suitable for use as a nanoribbon such as silicon (Si), SiGe, germanium, or III-V materials like indium phosphide (InP) or gallium arsenide (GaAs). In examples where SiGe is used in each of sacrificial layers 202 and in semiconductor layers 204, the germanium concentration is different between sacrificial layers 202 and semiconductor layers 204. For example, sacrificial layers 202 may include a higher germanium content compared to semiconductor layers 204. In some examples, semiconductor layers 204 may be doped with either n-type dopants (to produce a p-channel transistor) or p-type dopants (to produce an n-channel transistor).

While dimensions can vary from one example embodiment to the next, the thickness of each sacrificial layer 202 may be between about 5 nm and about 20 nm. In some embodiments, the thickness of each sacrificial layer 202 is substantially the same (e.g., within 1-2 nm), and the thickness of each of semiconductor layers 204 may be about the same as the thickness of each sacrificial layer 202 (e.g., about 5-20 nm). Each of sacrificial layers 202 and semiconductor layers 204 may be deposited using any known or proprietary material deposition technique, such as chemical vapor deposition (CVD), plasma-enhanced chemical vapor deposition (PECVD), physical vapor deposition (PVD), or atomic layer deposition (ALD).

Figure 3A:
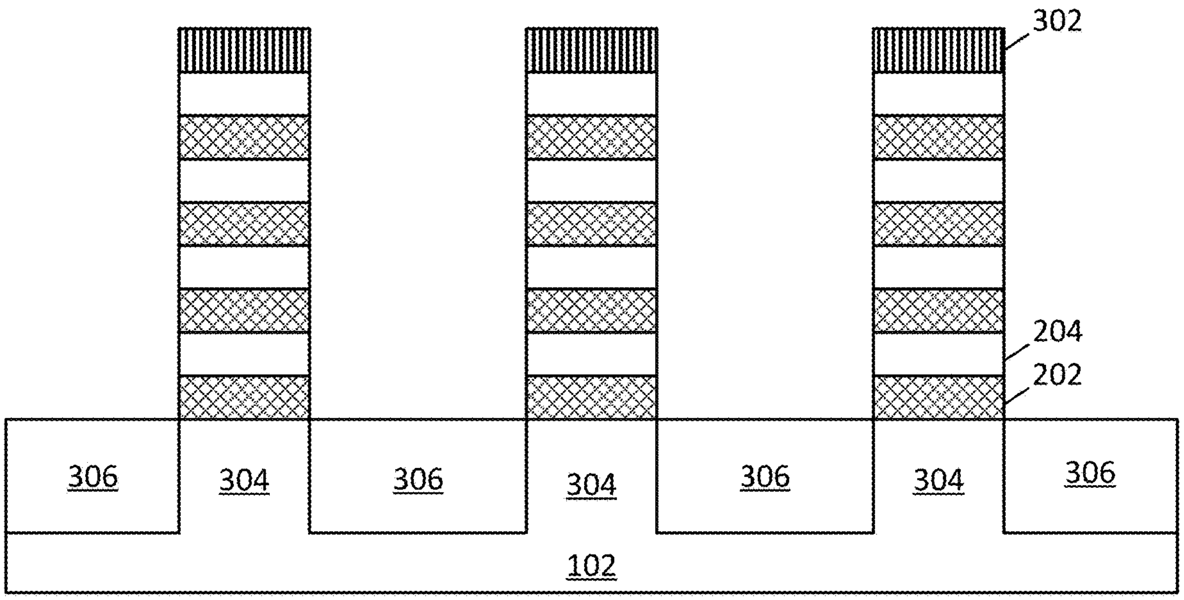
FIGS. 3A and 3B are cross-sectional views that illustrate another stage in the first example process for forming semiconductor devices that have a conductive bridge between source or drain contacts, in accordance with some embodiments of the present disclosure.
Figure 3B:
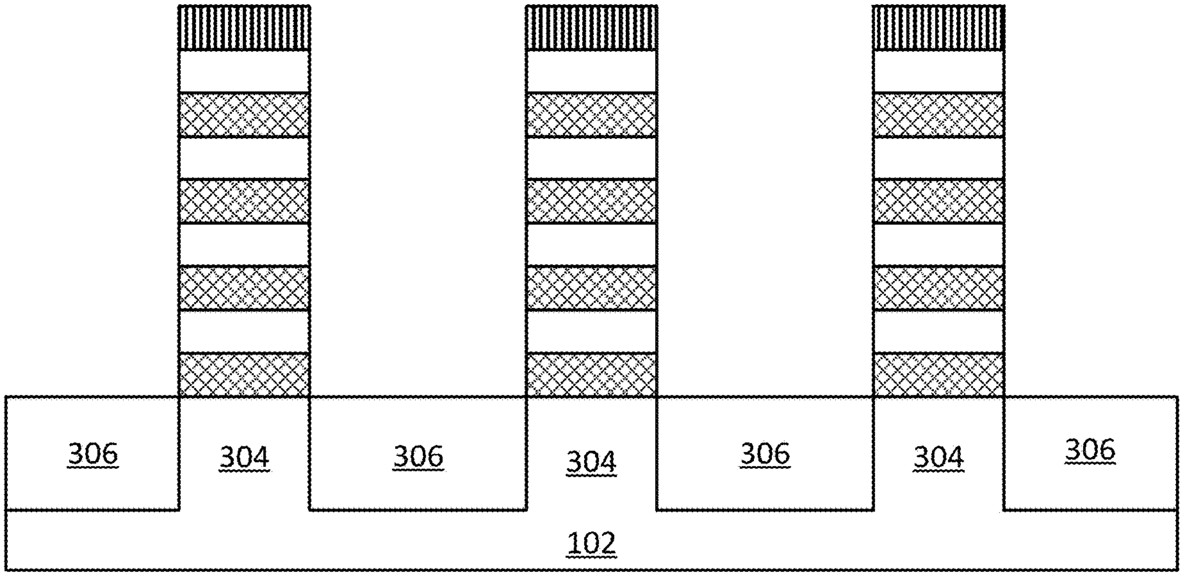

FIGS. 3A and 3B depict the cross-section views of the structure shown in FIGS. 2A and 2B, respectively, following the formation of a cap layer 302 and the subsequent formation of fins beneath cap layer 302, according to an embodiment. Cap layer 302 may be any suitable hard mask material such as a carbon hard mask (CHM) or silicon nitride. Cap layer 302 is patterned into rows to form corresponding rows of fins from the alternating layer stack of sacrificial layers 202 and semiconductor layers 204. The rows of fins extend lengthwise in a first direction (e.g., into and out of the page of each cross-section view).

According to some embodiments, an anisotropic etching process through the layer stack continues into at least a portion of substrate 102, where the unetched portions of substrate 102 beneath the fins form subfin regions 304. The etched portions of substrate 102 may be filled with a dielectric fill 306 that acts as shallow trench isolation (STI) between adjacent fins. Dielectric fill 306 may be any suitable dielectric material such as silicon dioxide, and may be recessed to a desired depth as shown (in this example case, down to around the upper surface of subfin regions 304), so as to define the active portion of the fins that will be covered by a gate structure. In some embodiments, dielectric fill 306 is recessed below the top surface of subfin regions 304.

Figure 4A:
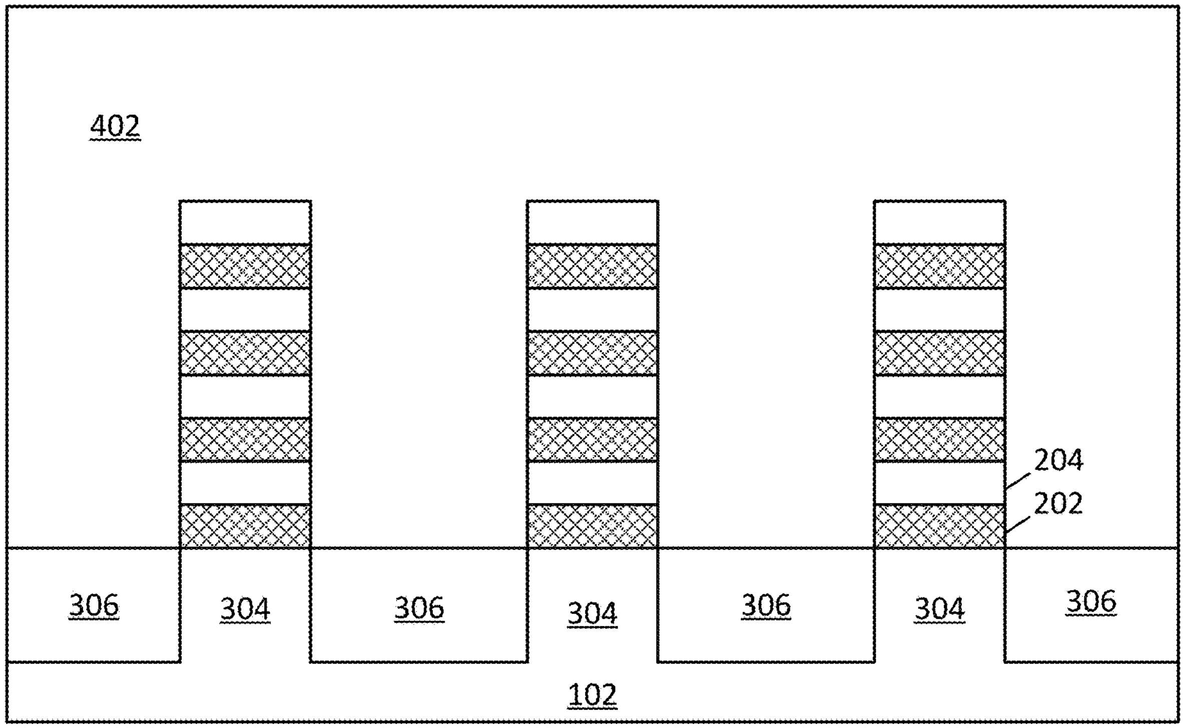
FIGS. 4A and 4B are cross-sectional views that illustrate another stage in the first example process for forming semiconductor devices that have a conductive bridge between source or drain contacts, in accordance with some embodiments of the present disclosure.
Figure 4B:
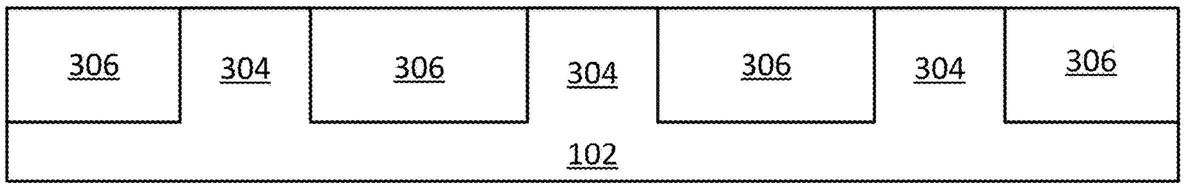

FIGS. 4A and 4B depict the cross-section views of the structure shown in FIGS. 3A and 3B, respectively, following the formation of a sacrificial gate 402 extending across the fins in a second direction different from the first direction, according to some embodiments. Sacrificial gate 402 may extend across the fins in a second direction that is orthogonal to the first direction. According to some embodiments, the sacrificial gate material is formed in parallel strips across the integrated circuit and removed in all areas not protected by a gate masking layer. Sacrificial gate 402 may be any suitable material that can be selectively removed without damaging the semiconductor material of the fins. In some examples, sacrificial gate 402 includes polysilicon.

As seen in the cross-section views, sacrificial gate 402 extends across the fins along the gate trench cross-section of FIG. 4A but is not present along the source/drain trench cross-section of FIG. 4B. Accordingly, sacrificial gate 402 (along with any gate spacers formed on the sidewalls of sacrificial gate 402) protect the underlying portions of the fins while the exposed portions of the fins are etched away as seen in FIG. 4B. According to some embodiments, both semiconductor layers 204 and sacrificial layers 202 are etched at substantially the same rate using an anisotropic reactive ion etching (RIE) process. As observed in FIG. 4B, the fins are completely removed above subfin regions 304. In some embodiments, the RIE process may also etch into subfin regions 304 thus recessing subfin regions 304 beneath a top surface of dielectric fill 306. In some embodiments, inner gate spacers can be formed after the source/drain trenches are etched and before any formation of source or drain regions. For instance, a selective etch can be used to laterally recess sacrificial layers 202, and that recess can then be filled with inner gate spacer material (e.g., silicon nitride or silicon oxynitride). Any excess gate spacer material can be removed with directional etching.

Figure 5A:
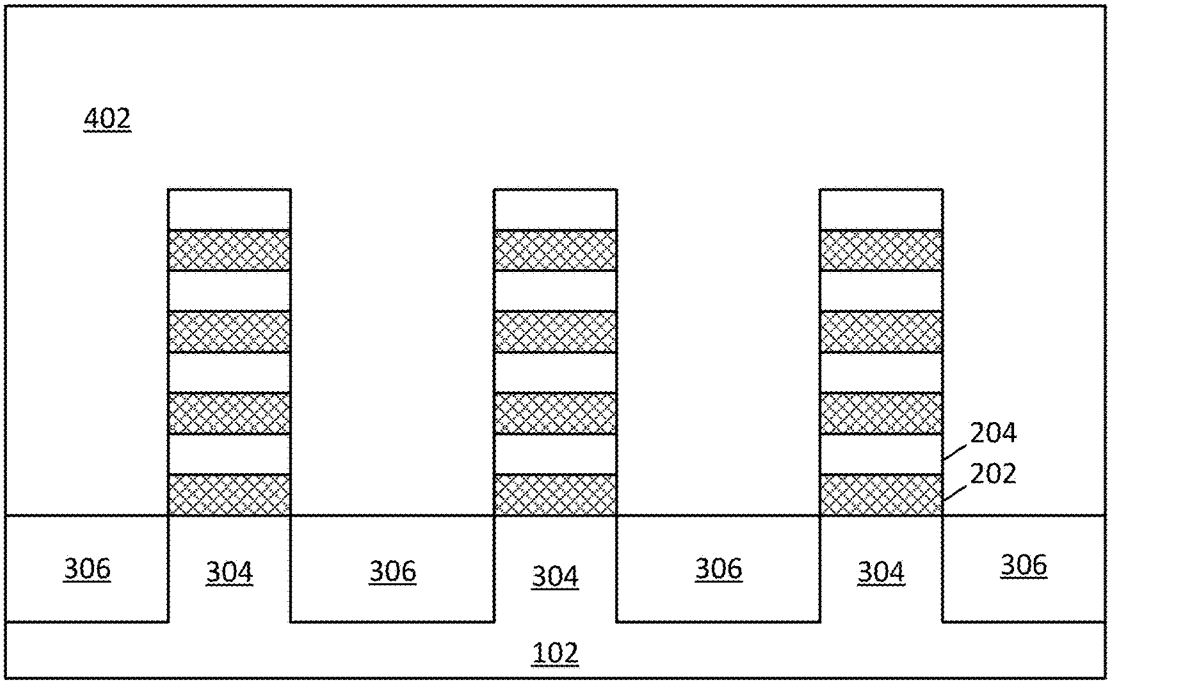
FIGS. 5A and 5B are cross-sectional views that illustrate another stage in the first example process for forming semiconductor devices that have a conductive bridge between source or drain contacts, in accordance with some embodiments of the present disclosure.
Figure 5B:
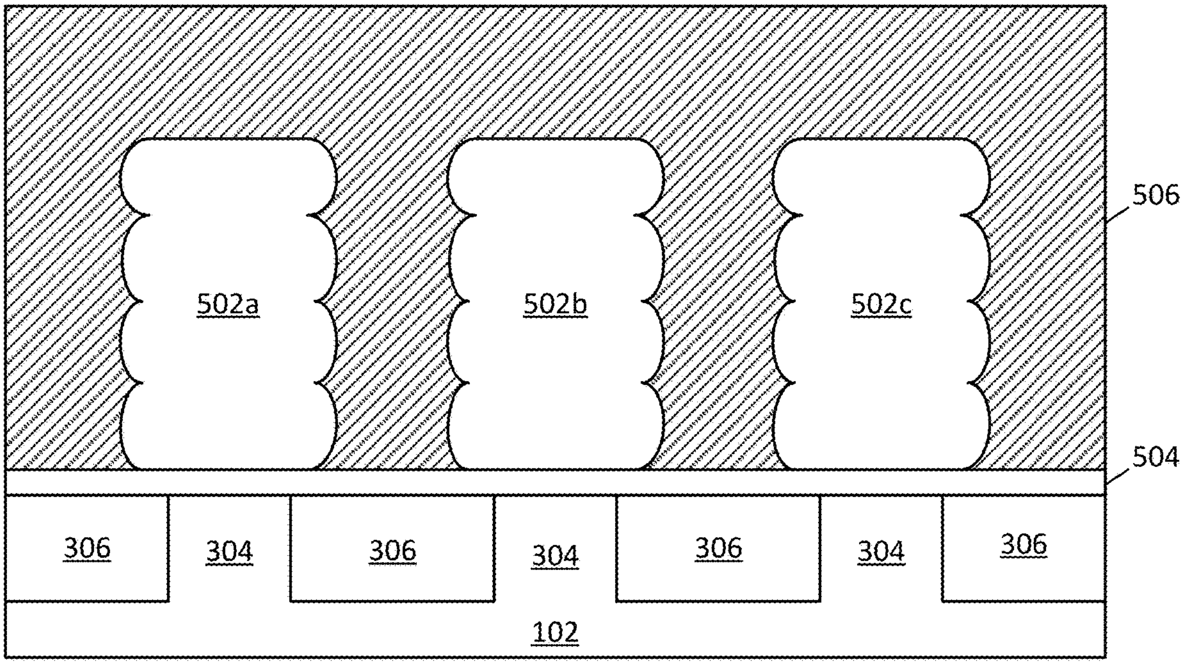

FIGS. 5A and 5B depict the cross-section views of the structure shown in FIGS. 4A and 4B, respectively, following the formation of source or drain regions 502*a*/502*b*/502*c* at the ends of each of the fins (extending into and out of the page in FIG. 5A), according to some embodiments. Source or drain regions 502*a*/502*b*/502*c* may be epitaxially grown from the exposed ends of semiconductor layers 204, such that the material grows together or otherwise merges towards the middle of the trenches between fins, according to some embodiments. Note that epitaxial growth on one semiconductor layer 204 can fully or partially merge with epitaxial growth on one or more other semiconductor layers 204 in the same vertical stack. The degree of any such merging can vary from one embodiment to the next. In the example of a PMOS device, a given source or drain region may be a semiconductor material (e.g., group IV or group III-V semiconductor materials) having a higher dopant concentration of p-type dopants compared to n-type dopants. In the example of an NMOS device, a given source or drain region may be a semiconductor material (e.g., group IV or group III-V semiconductor materials) having a higher dopant concentration of n-type dopants compared to p-type dopants. According to some embodiments, source or drain regions 502*a*/502*b*/502*c* grown from different semiconductor devices may be aligned along the source/drain trench in the second direction as shown in FIG. 5B.

According to some embodiments, a bottom dielectric layer 504 may be deposited prior to the formation of source or drain regions 502*a*/502*b*/502*c*. Bottom dielectric layer 504 may be any suitable dielectric material, such as silicon dioxide, silicon nitride, or silicon oxynitride. Bottom dielectric layer 504 may be included to provide isolation between source or drain regions 502*a*/502*b*/502*c* and subfin regions 304.

According to some embodiments, another dielectric fill 506 is provided along the source/drain trench. Dielectric fill 506 may extend between adjacent ones of the source or drain regions 502*a*/502*b*/502*c* along the second direction and also may extend up and over each of the source or drain regions 502*a*/502*b*/502*c*, according to some embodiments. Accordingly, each source or drain region may be isolated from any adjacent source or drain regions by dielectric fill 506. Dielectric fill 506 may be any suitable dielectric material, although in some embodiments, dielectric fill 506 includes the same dielectric material as dielectric fill 306 or bottom dielectric layer 504. In one example, each of dielectric fill 506, bottom dielectric layer 504, and dielectric fill 306 includes silicon dioxide. Dielectric fill 506 may not be present between certain adjacent source or drain regions in situations where the adjacent source or drain regions are desired to be electrically coupled together. According to some embodiments, a top surface of dielectric fill 506 may be polished using, for example, chemical mechanical polishing (CMP). The top surface of dielectric fill 506 may be polished until it is substantially coplanar with a top surface of sacrificial gate 402.

Figure 6A:
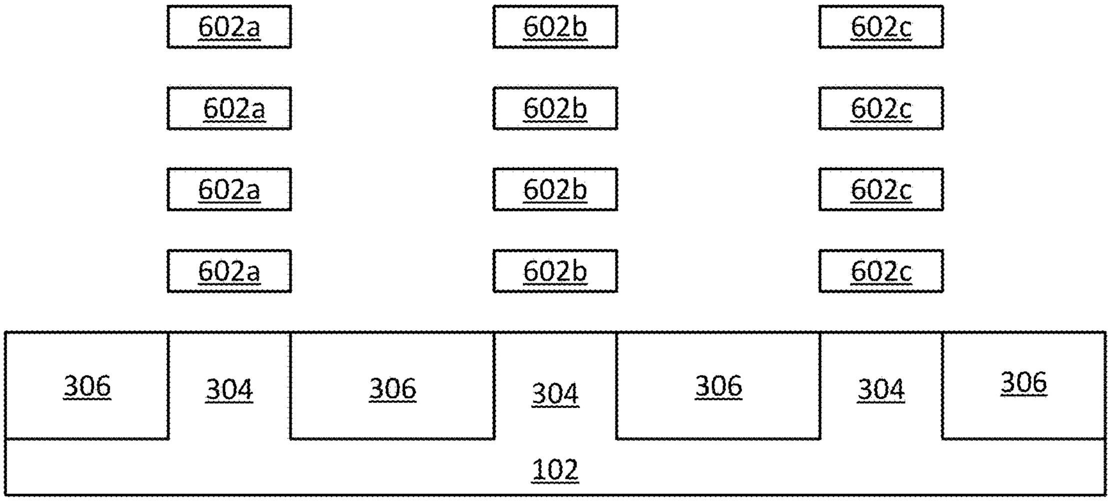
FIGS. 6A and 6B are cross-sectional views that illustrate another stage in the first example process for forming semiconductor devices that have a conductive bridge between source or drain contacts, in accordance with some embodiments of the present disclosure.
Figure 6B:
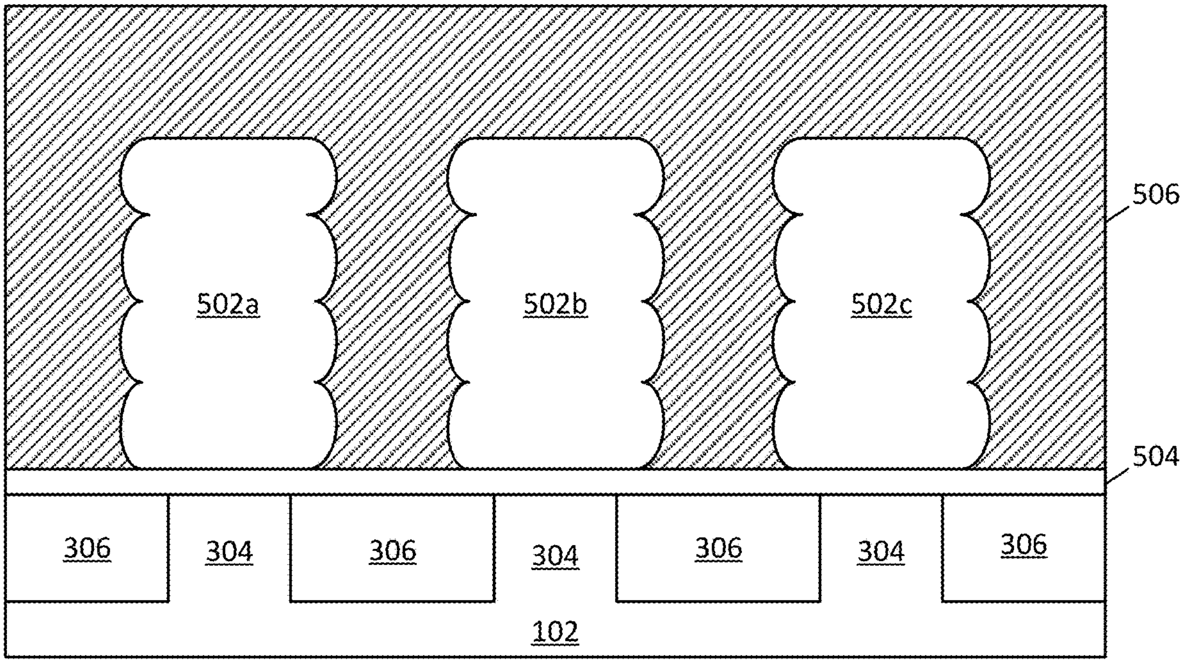

FIGS. 6A and 6B depict the cross-section views of the structure shown in FIGS. 5A and 5B, respectively, following the formation of nanoribbons 602*a*/602*b*/602*c* from semiconductor layers 204, according to some embodiments. Depending on the dimensions of the structures, nanoribbons 602*a*/602*b*/602*c* may also be considered nanowires or nanosheets. Sacrificial gate 402 may be removed using any wet or dry isotropic process thus exposing the alternating layer stack of the fins within the trenches left behind after the removal of sacrificial gate 402. Once sacrificial gate 402 is removed, sacrificial layers 202 may also be removed using a selective isotropic etching process that removes the material of sacrificial layers 202 but does not remove (or removes very little of) semiconductor layers 204 or any other exposed layers (e.g., inner gate spacers). At this point, the suspended (sometimes called released) semiconductor layers 204 form nanoribbons 602a/602b/602c that extend in the first direction (into and out of the page) between corresponding source or drain regions 502a/502b/502c.

Figure 7A:
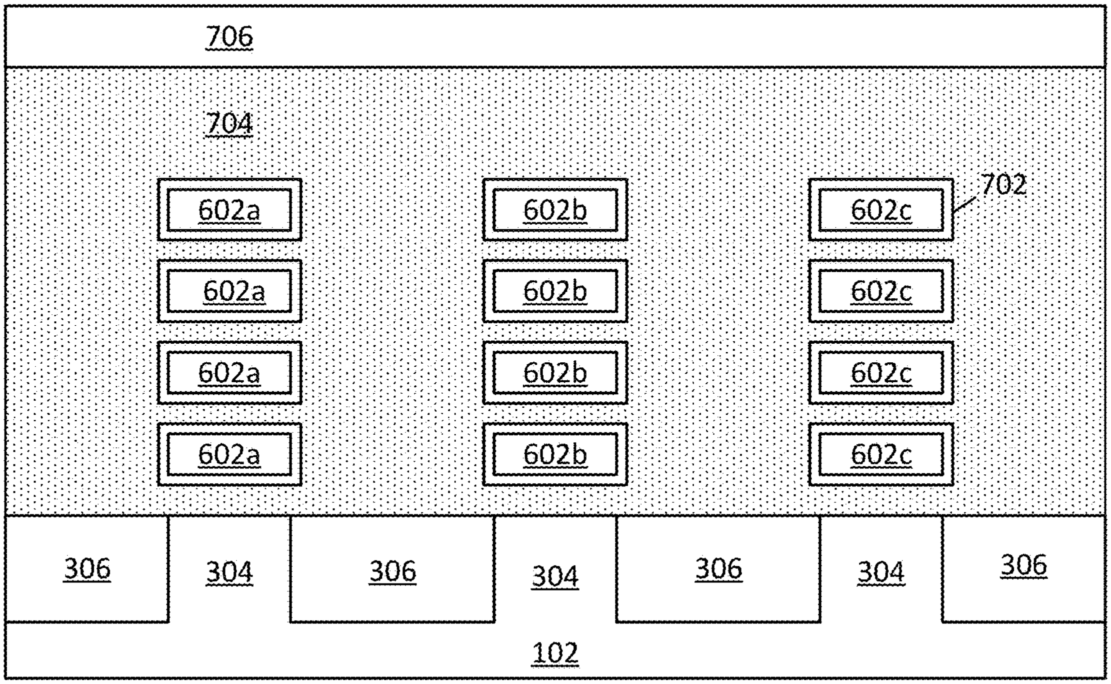
FIGS. 7A and 7B are cross-sectional views that illustrate another stage in the first example process for forming semiconductor devices that have a conductive bridge between source or drain contacts, in accordance with some embodiments of the present disclosure.
Figure 7B:
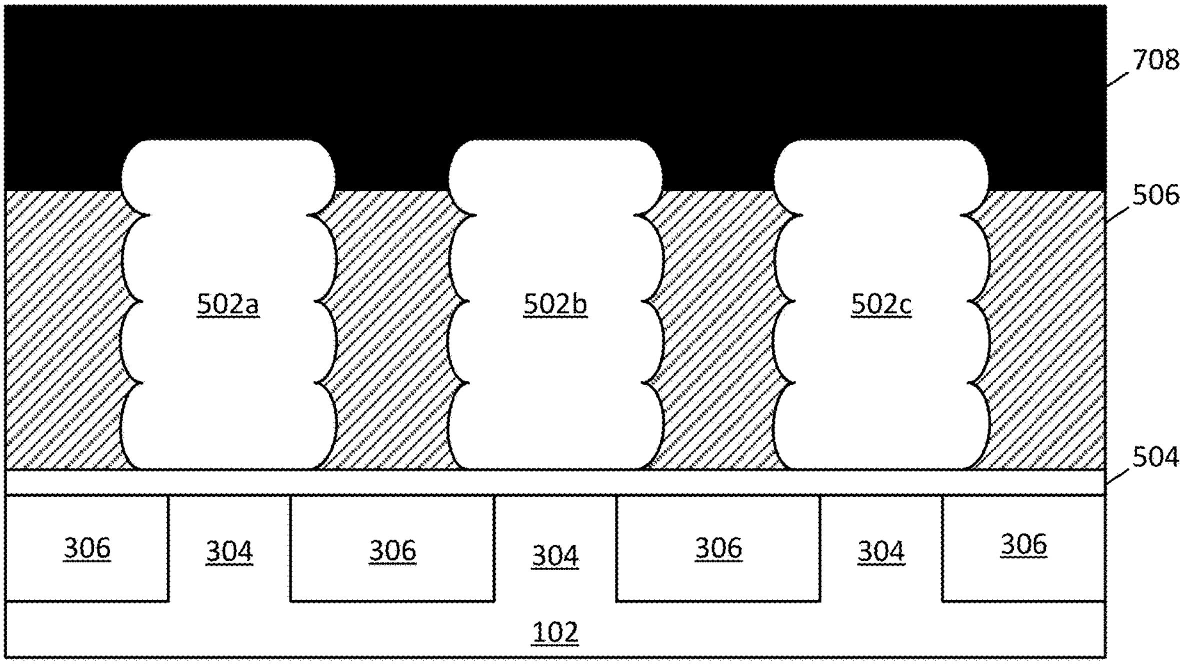

FIGS. 7A and 7B depict the cross-section views of the structure shown in FIGS. 6A and 6B, respectively, following the formation of a gate structure around nanoribbons 602a/602b/602c within the gate trench, according to some embodiments. As noted above, the gate structure includes a gate dielectric 702 and a gate electrode 704. Gate dielectric 702 may be conformally deposited around nanoribbons 602a/602b/602c using any suitable deposition process, such as atomic layer deposition (ALD). Gate dielectric 702 may include any suitable dielectric (such as silicon dioxide, and/or a high-k dielectric material). Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. According to some embodiments, gate dielectric 702 is hafnium oxide with a thickness between about 1 nm and about 5 nm. In some embodiments, gate dielectric 702 may include one or more silicates (e.g., titanium silicate, tungsten silicate, niobium silicate, and silicates of other transition metals). Gate dielectric 702 may be a multilayer structure, in some examples. For instance, gate dielectric 702 may include a first layer on nanoribbons 602a/602b/602c, and a second layer on the first layer. The first layer can be, for instance, an oxide of the semiconductor layers (e.g., silicon dioxide) and the second layer can be a high-k dielectric material (e.g., hafnium oxide). In some embodiments, an annealing process may be carried out on gate dielectric 702 to improve its quality when a high-k dielectric material is used. In some embodiments, the high-k material can be nitridized to improve its aging resistance.

Gate electrode 704 may be deposited over gate dielectric 702 and can be any conductive structure. In some embodiments, gate electrode 704 includes doped polysilicon, a metal, or a metal alloy. Example suitable metals or metal alloys include aluminum, tungsten, cobalt, molybdenum, ruthenium, titanium, tantalum, copper, and carbides and nitrides thereof. Gate electrode 704 may include, for instance, one or more workfunction layers, resistance-reducing layers, and/or barrier layers. The workfunction layers can include, for example, p-type workfunction materials (e.g., titanium nitride) for PMOS gates, or n-type workfunction materials (e.g., titanium aluminum carbide) for NMOS gates.

According to some embodiments, a gate cap 706 may be formed by first recessing gate electrode 704 and filling the recess with a dielectric material. The dielectric material may then be polished such that its top surface is substantially coplanar with any adjacent spacer structures or material within the source/drain trench. Gate cap 706 may be any suitable dielectric material, such as silicon nitride.

According to some embodiments, a portion of dielectric fill 506 may be recessed within the source/drain trench to expose at least a top surface of source or drain regions 502a/502b/502c. A conductive contact 708 may be formed within the recess to contact at least the top surfaces of source or drain regions 502a/502b/502c. In some embodiments, dielectric fill 506 is recessed far enough to expose one or more side surfaces of source or drain regions 502a/502b/502c, in which case conductive contact 708 also contacts the exposed side surfaces of source or drain regions 502a/502b/502c. Conductive contact 708 may include any suitable conductive material, such as tungsten, molybdenum, or ruthenium, for making electrical contact with the underlying source or drain regions 502a/502b/502c. A top surface of conductive contact 708 may be polished to be substantially coplanar with a top surface of gate cap 706.

Figure 8A:
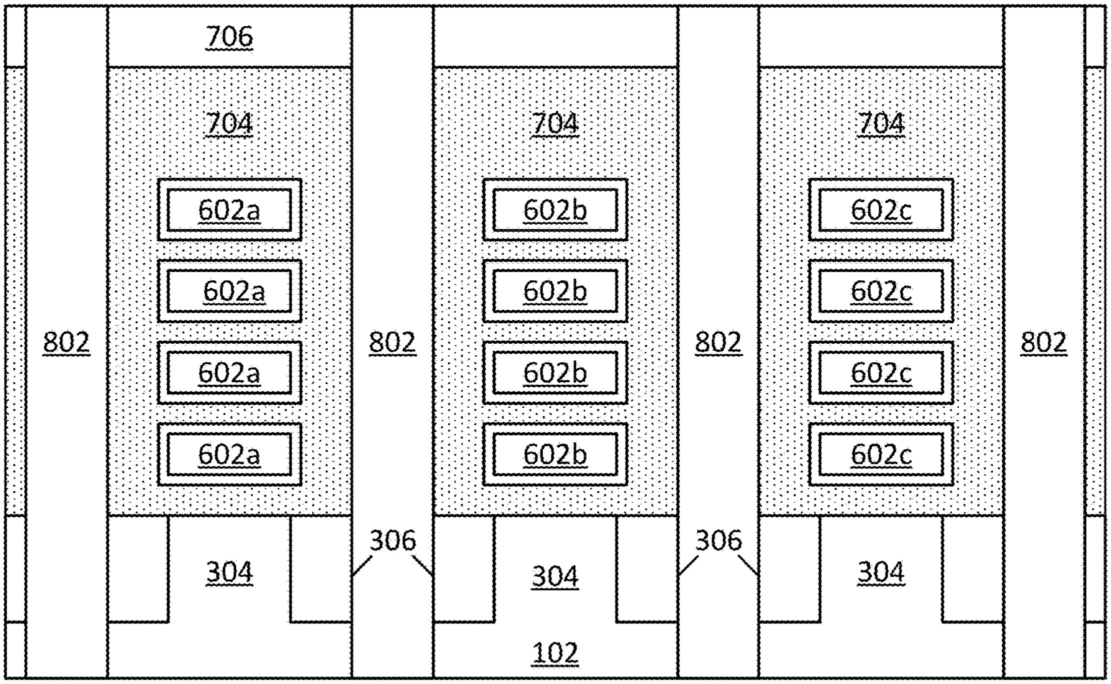
FIGS. 8A and 8B are cross-sectional views that illustrate another stage in the first example process for forming semiconductor devices that have a conductive bridge between source or drain contacts, in accordance with some embodiments of the present disclosure.
Figure 8B:
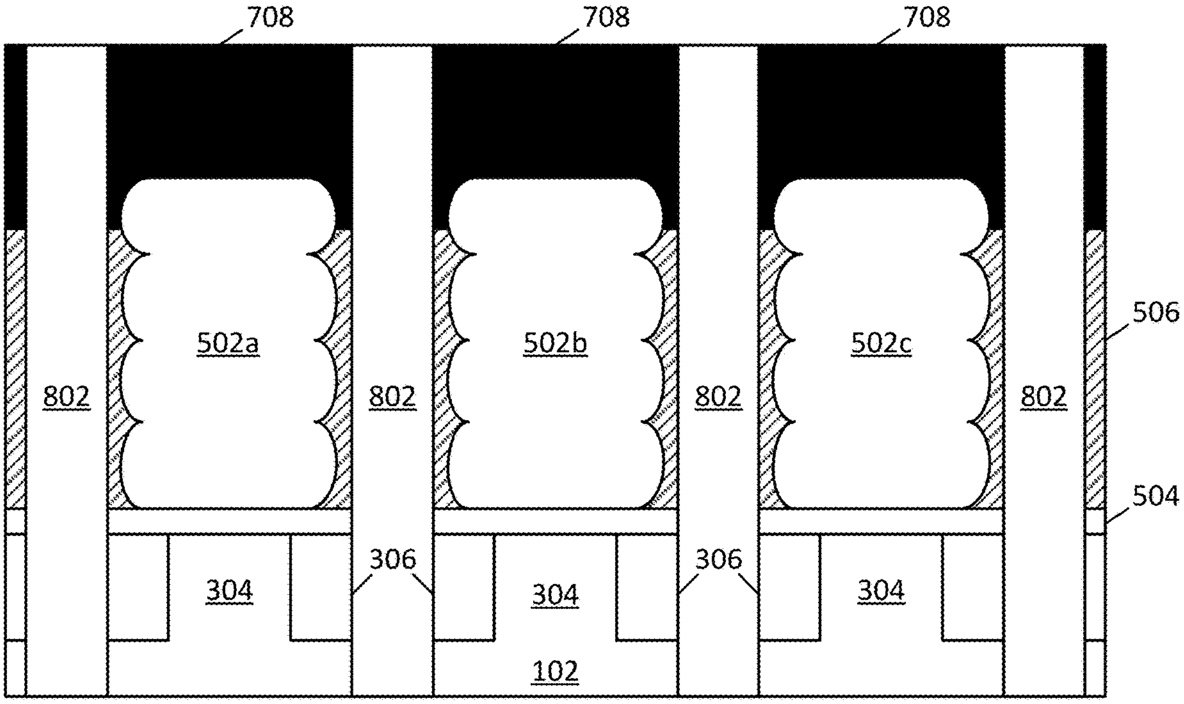

FIGS. 8A and 8B depict cross-section views of the structure shown in FIGS. 7A and 7B, respectively, following the formation of dielectric walls 802 extending in the first direction between adjacent devices, according to some embodiments. Dielectric walls 802 extend to a depth at least through an entire thickness of the gate structures to isolate separate gate structures along the second direction. In some embodiments, dielectric walls 802 extend into at least a portion of dielectric fill 306 or through an entire thickness of dielectric fill 306. In some embodiments, dielectric walls 802 extend entirely through dielectric fill 306 and into a portion of substrate 102.

According to some embodiments, dielectric walls 802 may be formed by first forming corresponding gate cut recesses through gate cap 706, contact 708 and gate electrode 704 using any suitable metal gate etch process that iteratively etches through portions of gate electrode 704 while simultaneously protecting the sidewalls of the recess from lateral etching to provide a high height-to-width aspect ratio recess (e.g., aspect ratio of 5:1 or higher, or 10:1 or higher). The gate cut recesses may extend in the first direction through multiple gate trenches and source/drain trenches to isolate adjacent gate structures and source or drain regions. The gate cut recesses may be filled with one or more dielectric materials to form dielectric walls 802. For example, dielectric walls 802 may include only silicon oxide or silicon nitride or silicon carbide. In some examples, dielectric walls 802 include a first dielectric layer deposited first and a second dielectric layer or dielectric fill formed on the first dielectric layer. The first dielectric layer may include a high-k dielectric material (e.g., materials with a dielectric constant higher than that of silicon oxide or higher than 3.9) while the second dielectric layer may include a low-k dielectric material (e.g. materials with a dielectric constant equal to or lower than that of silicon oxide, such as porous silicon oxide, or equal to or lower than 3.9). In the illustrated example, dielectric wall 802 separates conductive contact 708 into different conductive contacts 708 over each of source or drain regions 502a/502b/502c. In some examples where devices are closely packed, dielectric walls 802 may contact one or more sidewalls of source or drain regions 502a/502b/502c.

Figure 9A:
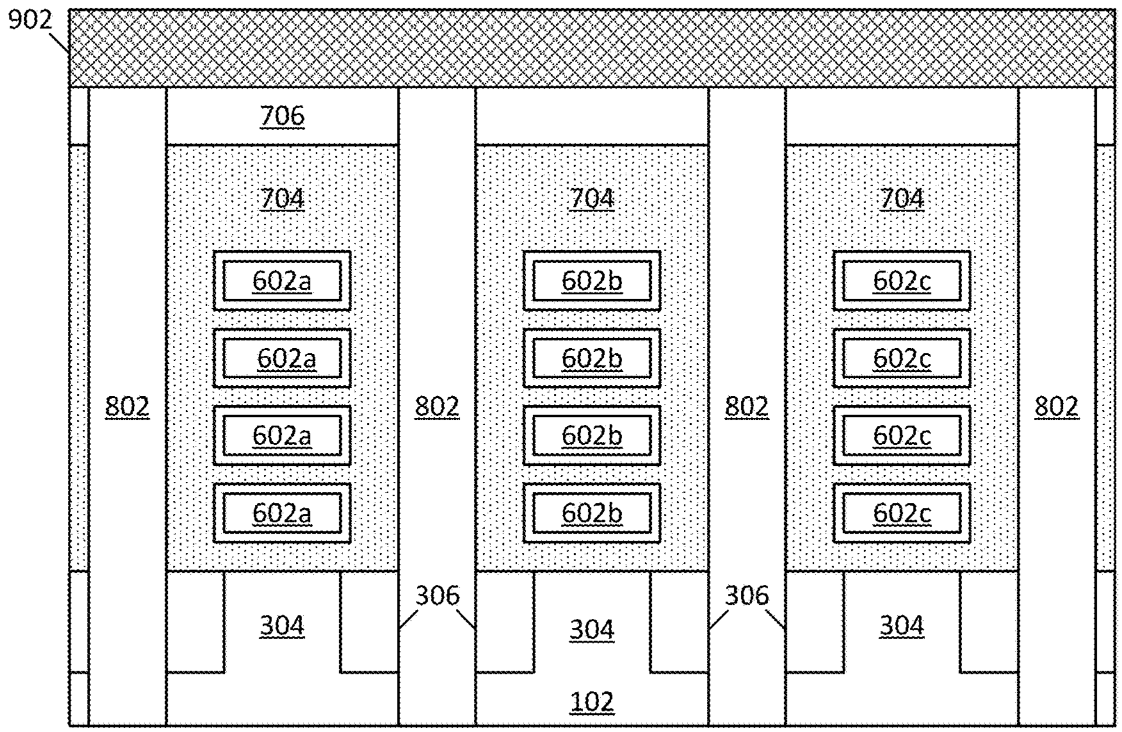
FIGS. 9A and 9B are cross-sectional views that illustrate another stage in the first example process for forming semiconductor devices that have a conductive bridge between source or drain contacts, in accordance with some embodiments of the present disclosure.
Figure 9B:
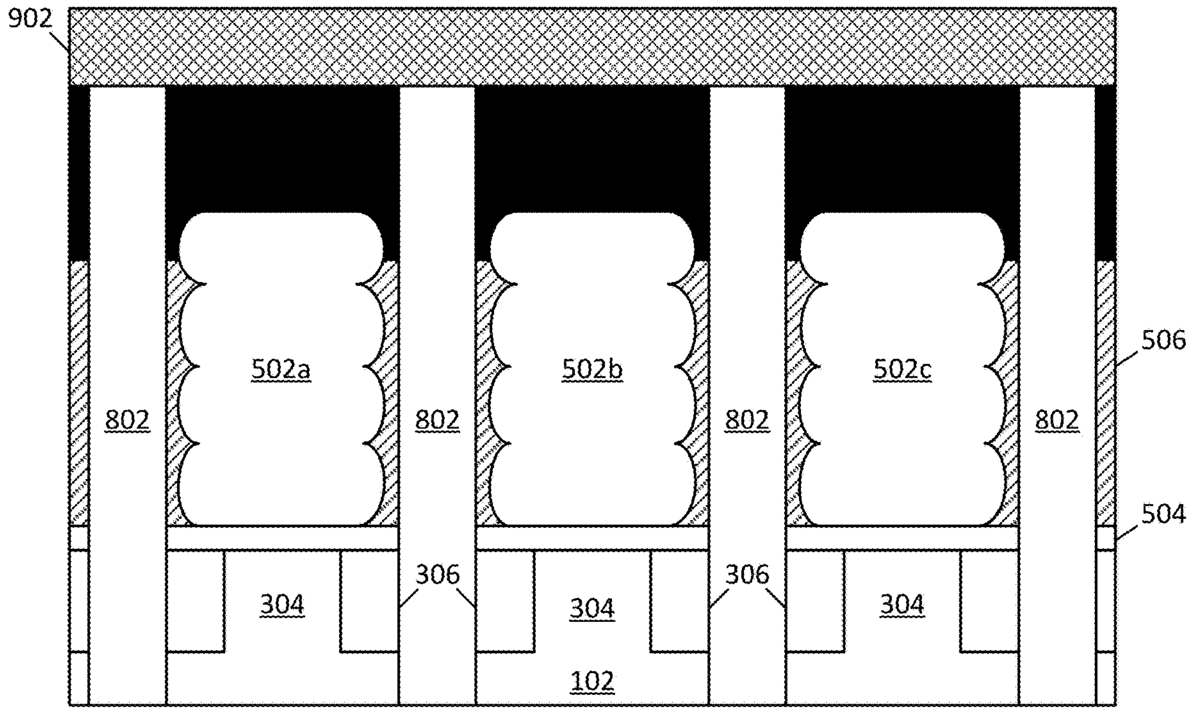

FIGS. 9A and 9B depict the cross-section views of the structure shown in FIGS. 8A and 8B, respectively, following the formation of a masking structure over a top surface of the integrated circuit, according to some embodiments. A first masking layer 902 may be formed over the entire structure and can be any suitable hard mask material, such as silicon dioxide.

Figure 10A:
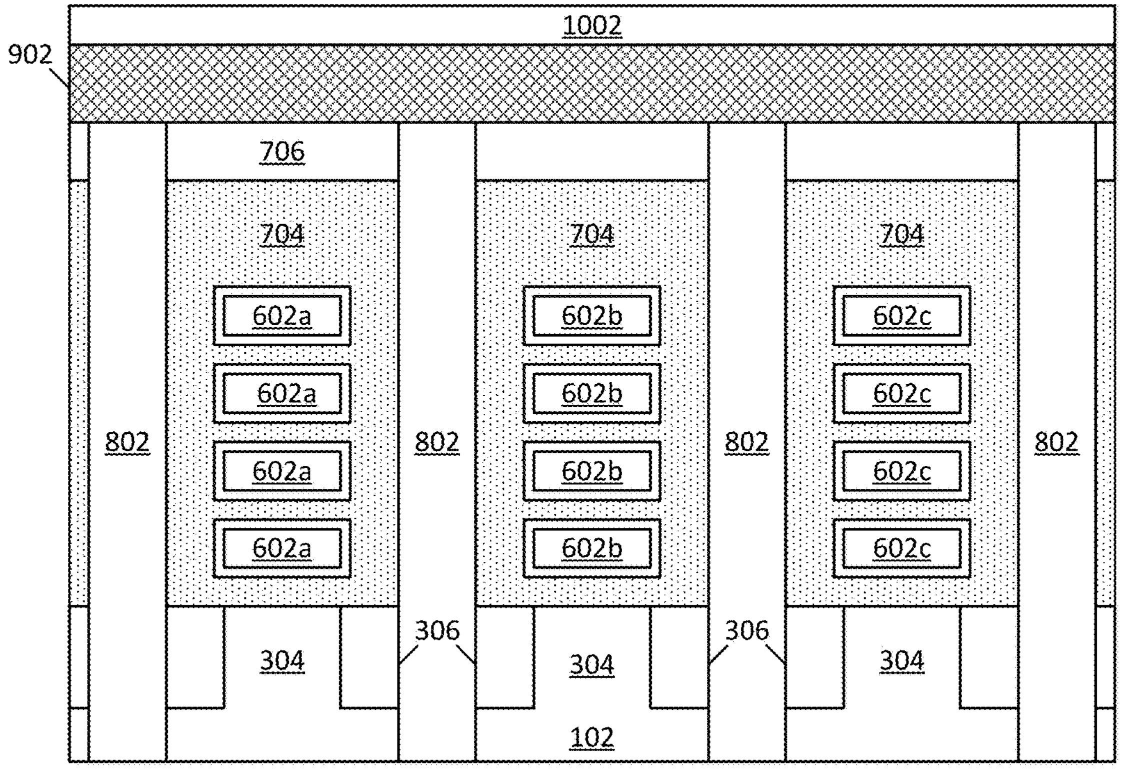
FIGS. 10A and 10B are cross-sectional views that illustrate another stage in the first example process for forming semiconductor devices that have a conductive bridge between source or drain contacts, in accordance with some embodiments of the present disclosure.
Figure 10B:
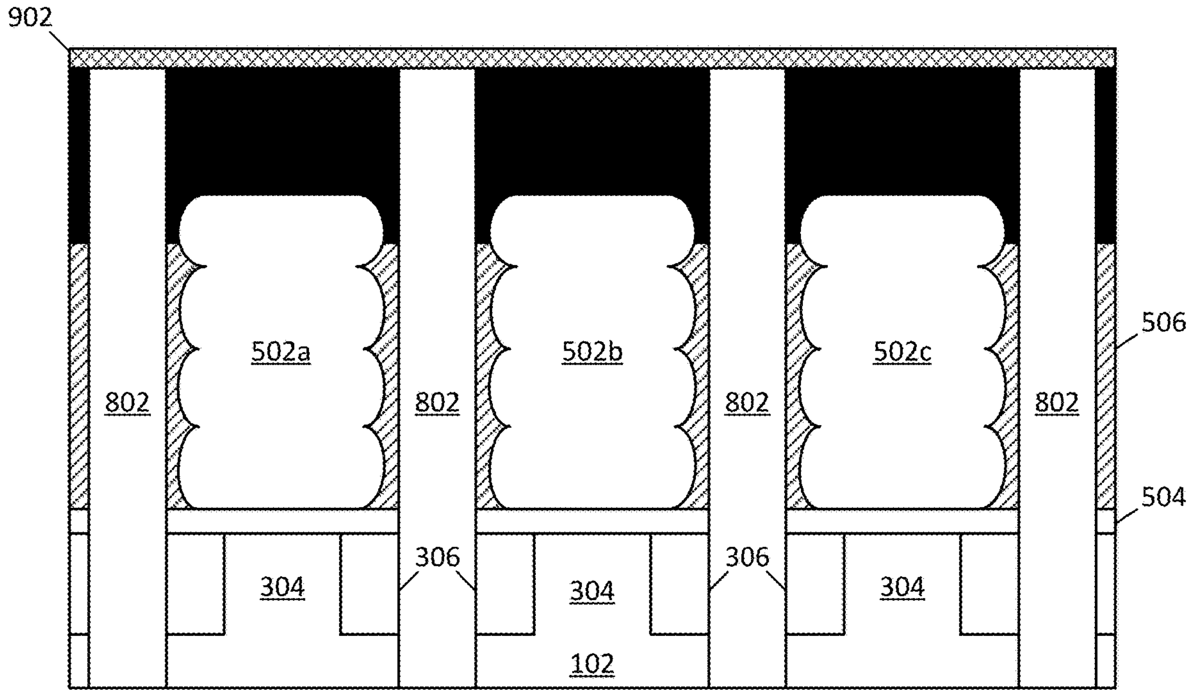

FIGS. 10A and 10B depict the cross-section views of the structure shown in FIGS. 9A and 9B, respectively, following the recessing of first masking layer 902 over the source/drain trench and subsequent formation of second masking layer 1002 over the gate trench, according to some embodiments. Any suitable lithography technique may be used with another masking material to recess portions of first masking layer 902 over the source/drain trench while protecting portions of first masking layer 902 over the gate trench. An RIE process may be used to recess the exposed first masking layer 902. In some examples, first masking layer 902 is recessed by at least 80%, at least 85%, or at least 90% of its total thickness. In some examples, first masking layer 902 is removed completely from over the source/drain trench.

According to some embodiments, a second masking layer 1002 may be formed on the top surface of the raised portions of first masking layer 902 over the gate trench. Briefly, the masking material used to protect first masking layer 902 during the recessing of first masking layer 902 is removed and a physical vapor deposition (PVD) process (e.g., sputtering) is used to form second masking layer 1002 primarily on top of the raised surfaces of first masking layer 902. Second masking layer 1002 may be a different material than first masking layer 902 and exhibit a high etch selectivity with first masking layer 902 or a high etch selectivity with any dielectric materials. In some embodiments, second masking layer 1002 includes a metal such as titanium nitride.

Figure 11A:
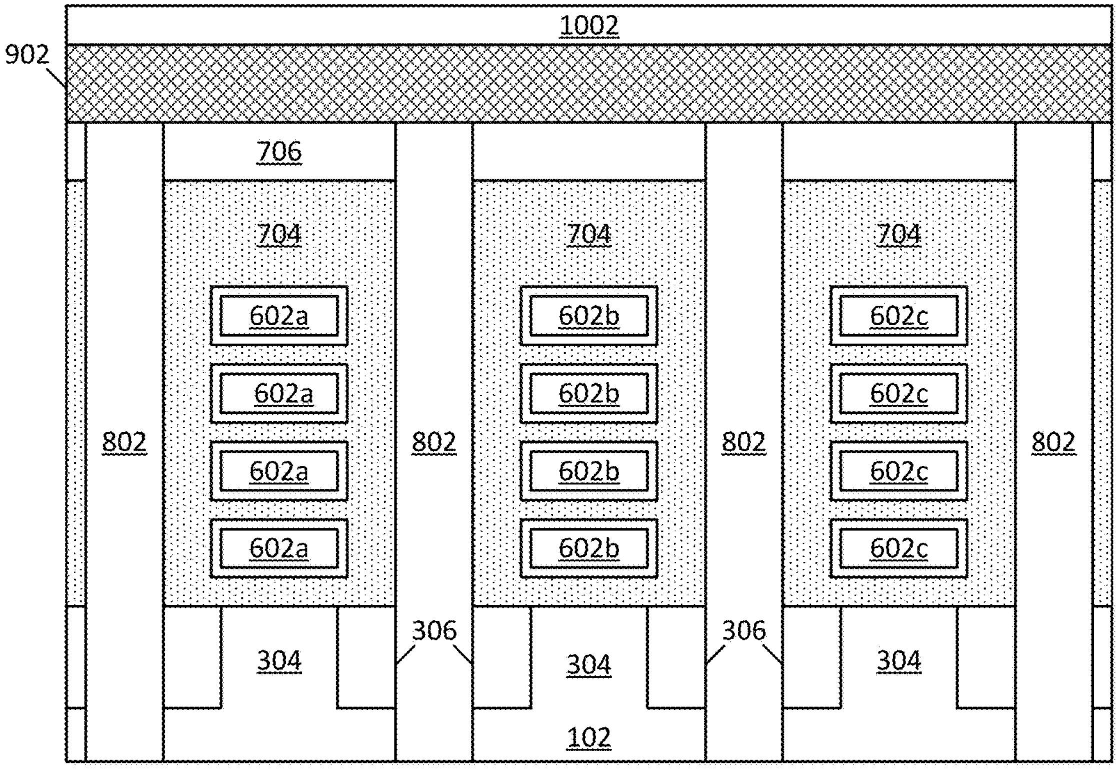
FIGS. 11A and 11B are cross-sectional views that illustrate another stage in the first example process for forming semiconductor devices that have a conductive bridge between source or drain contacts, in accordance with some embodiments of the present disclosure.
Figure 11B:
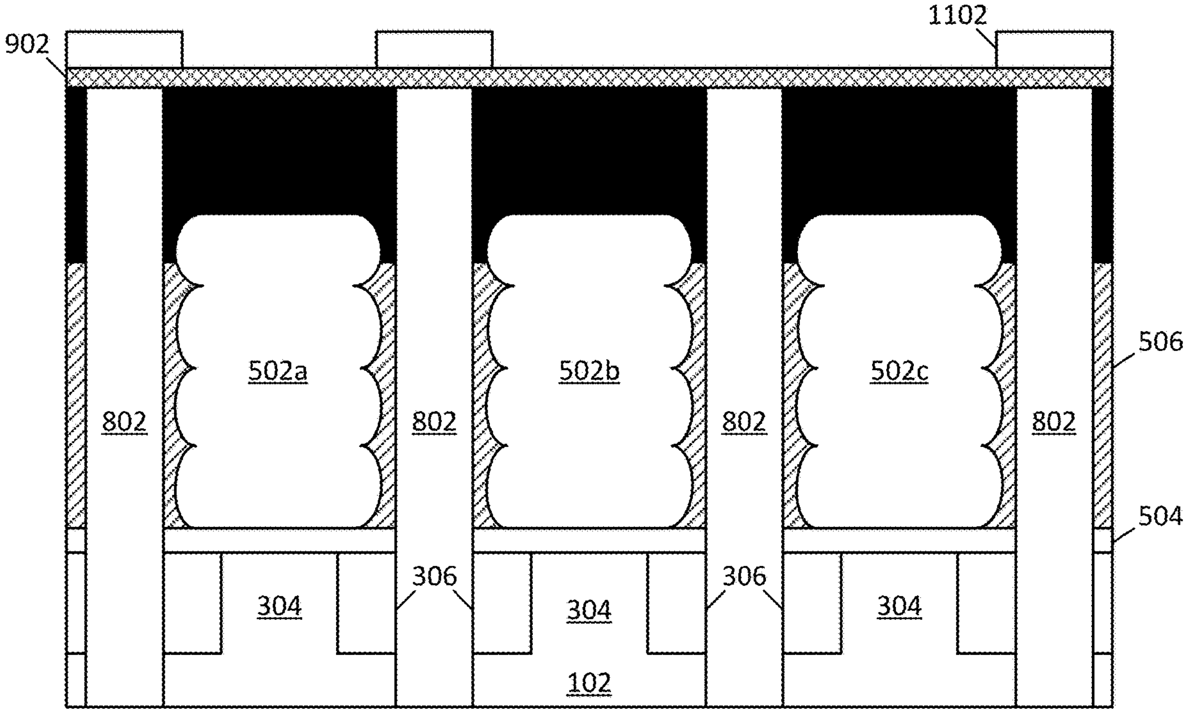

FIGS. 11A and 11B depict the cross-section views of the structure shown in FIGS. 10A and 10B, respectively, following the formation and patterning of a blocking layer 1102, according to some embodiments. Blocking layer 1102 may be any suitable hard mask material such as silicon dioxide or silicon nitride. Blocking layer 1102 may have a different material composition compared to first masking layer 902. According to some embodiments, blocking layer 1102 is patterned using any suitable lithography process to remain over any number of dielectric walls 802. Any dielectric walls 802 that do not include blocking layer 1102 above them will be recessed during subsequent processing operations for the formation of conductive bridges between contacts. Accordingly, blocking layer 1102 may be used to select where such conductive bridges will be formed across the integrated circuit.

Figure 12A:
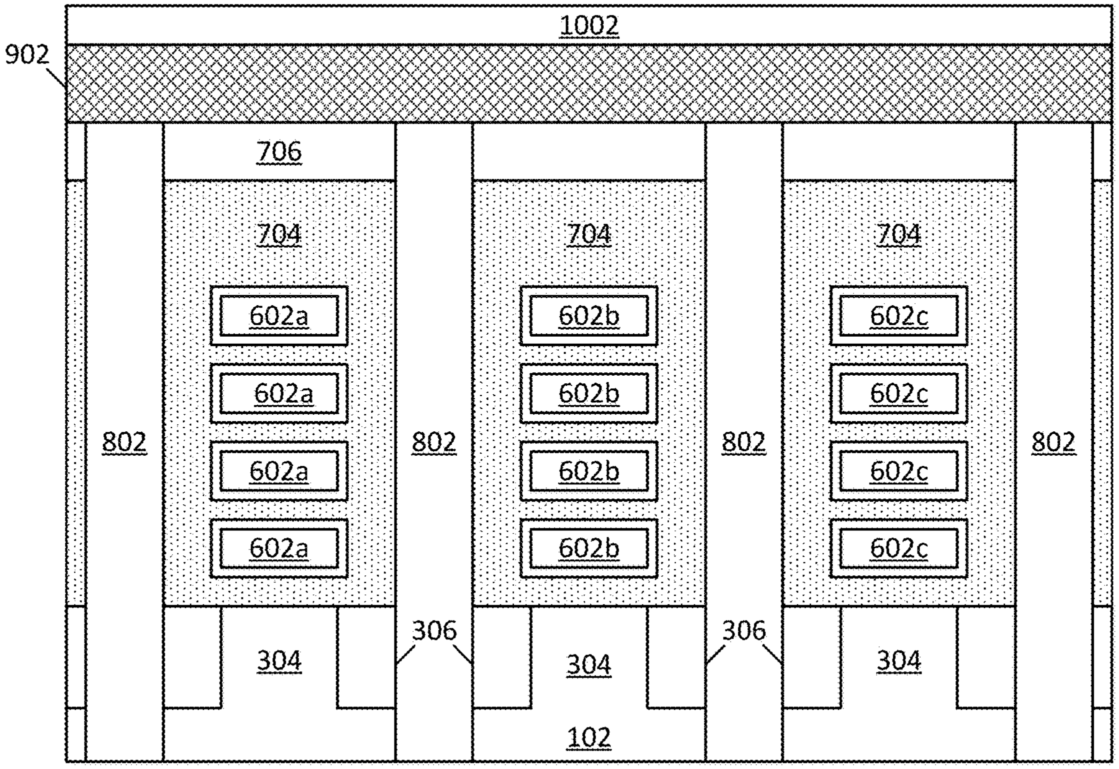
FIGS. 12A and 12B are cross-sectional views that illustrate another stage in the first example process for forming semiconductor devices that have a conductive bridge between source or drain contacts, in accordance with some embodiments of the present disclosure.
Figure 12B:
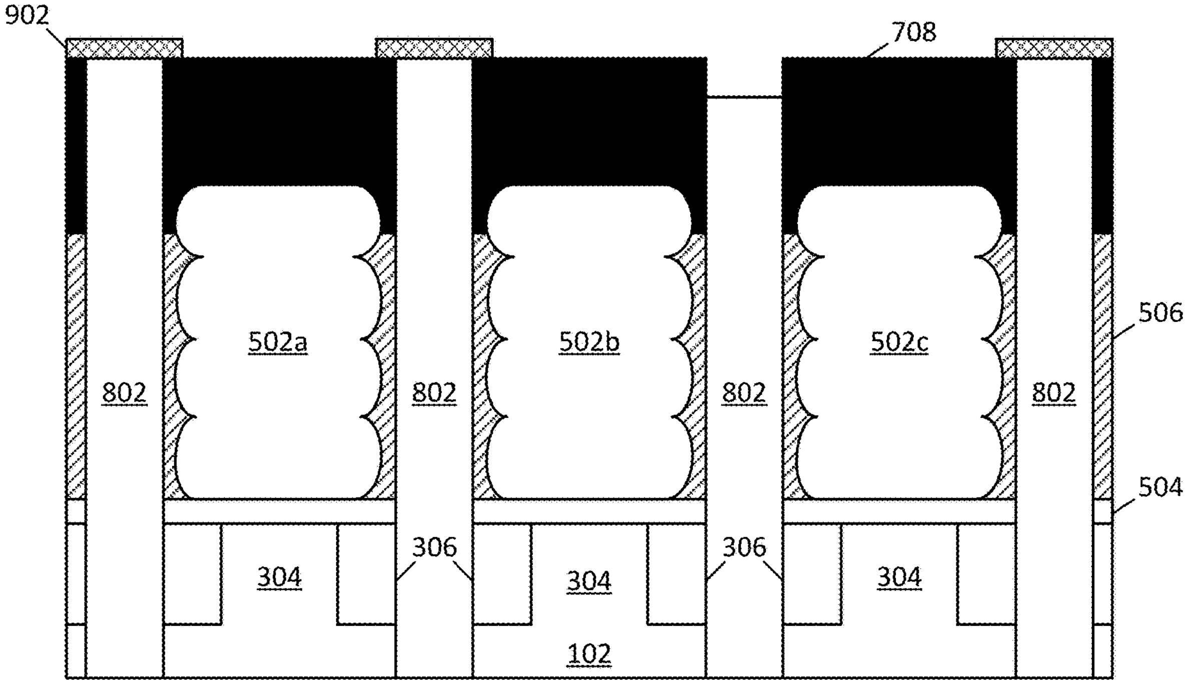

FIGS. 12A and 12B depict the cross-section views of the structure shown in FIGS. 11A and 11B, respectively, following an etching process to recess any dielectric walls 802 not protected by blocking layer 1102, according to some embodiments. Blocking layer 1102 may be entirely consumed during the etching process that causes the recessing of dielectric wall 802. In some examples, portions of blocking layer 1102 may remain over remaining portions of first masking layer 902. According to some embodiments, an RIE process may be used to remove exposed portions (e.g., not protected by blocking layer 1102) of first masking layer 902 and subsequently a portion of the exposed dielectric wall 802. It should be noted that the etching process removes little to none of the exposed metal materials from conductive contact 708 and little to none of second masking layer 1002.

Figure 13A:
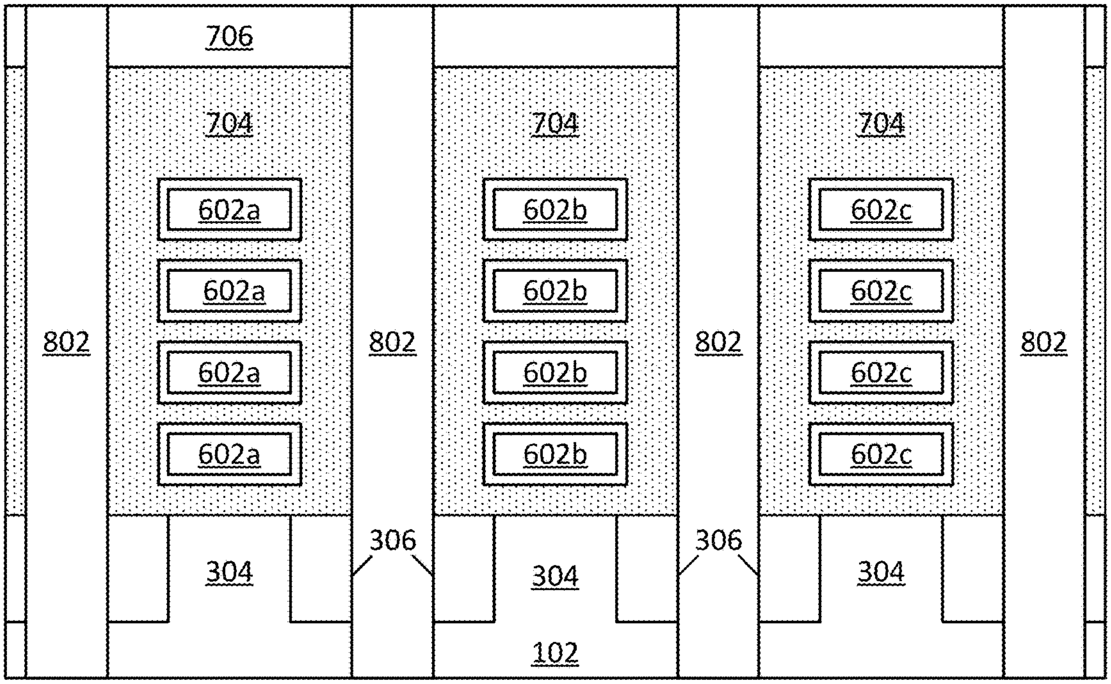
FIGS. 13A and 13B are cross-sectional views that illustrate another stage in the first example process for forming semiconductor devices that have a conductive bridge between source or drain contacts, in accordance with some embodiments of the present disclosure.
Figure 13B:
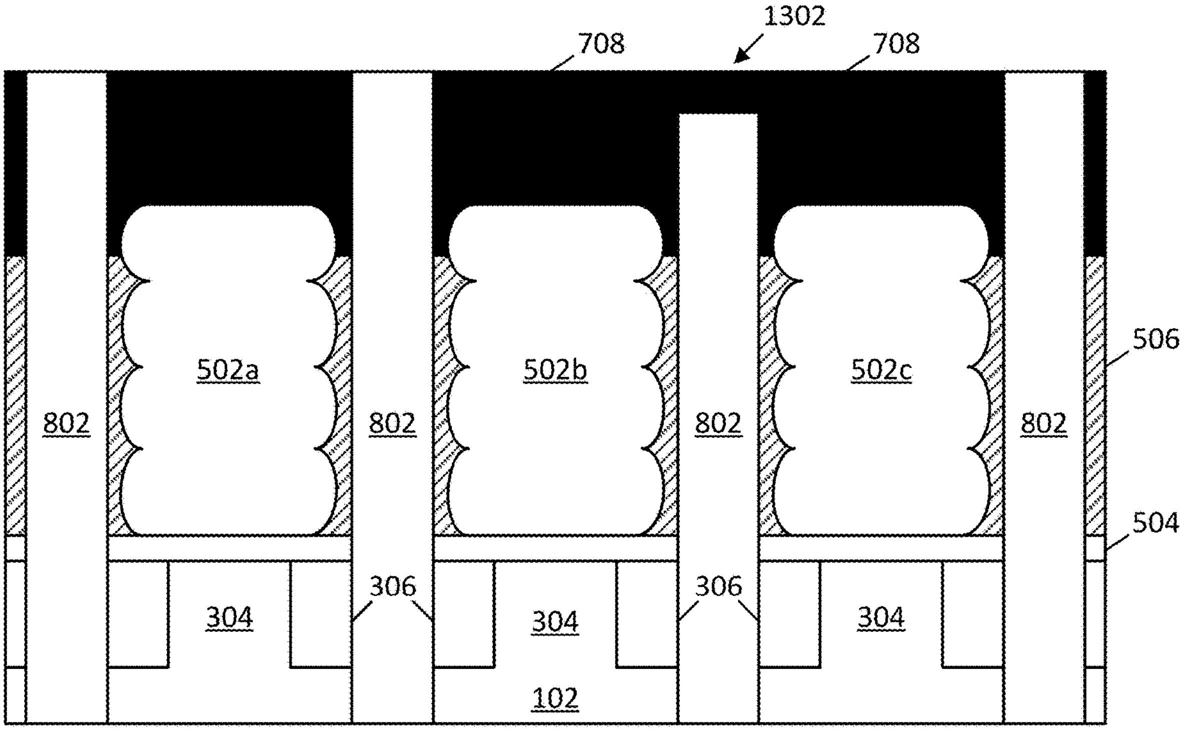

FIGS. 13A and 13B depict the cross-section views of the structure shown in FIGS. 12A and 12B, respectively, following the formation of a conductive bridge 1302 within the recessed portion of dielectric wall 802 and the subsequent removal of the masking layers, according to some embodiments. Conductive bridge 1302 extends through an upper portion of dielectric wall 802 to contact both conductive contacts 708 on either side of dielectric wall 802. In some examples, conductive bridge 1302 includes the same conductive material as conductive contacts 708. In other examples, the conductive material of conductive bridge 1302 is different from the conductive material of conductive contacts 708. In some examples, new conductive contacts may be formed at the same time as conductive bridge 1302 such that no seams or grain boundaries are present between the elements. A polishing procedure using, for example, CMP may be used to planarize a top surface of conductive bridge 1302 such that it is substantially coplanar with a top surface of conductive contacts 708. Conductive bridge 1302 forms a conductive link between the adjacent conductive contacts 708 within the device layer below any frontside interconnect layers, according to some embodiments.

FIGS. 14A-17A and 14B-17B are cross-sectional views that collectively illustrate a second example process for forming an integrated circuit configured with a conductive bridge between source or drain contacts, in accordance with an embodiment of the present disclosure. Similarly, FIGS. 14A-17A represent cross-sectional views taken across a gate trench of the integrated circuit, while FIGS. 14B-17B represent cross-sectional views taken across the source/drain trench adjacent to the gate trench along the same direction. Each figure shows an example structure that results from the process flow up to that point in time, so the depicted structure evolves as the process flow continues, culminating in the structure shown in FIGS. 17A and 17B. The second example process includes similar operations as shown in FIGS. 2A-8A and 2B-8B of the first example process to produce the structure shown in FIGS. 14A and 14B.

Figure 14A:
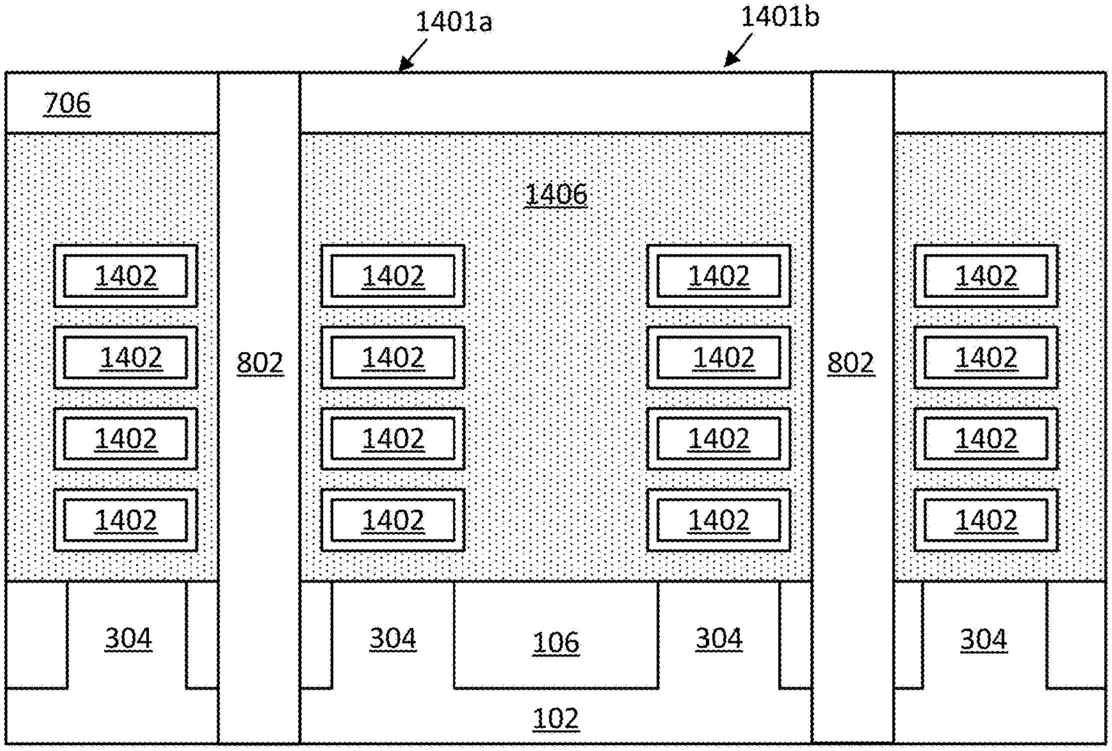
FIGS. 14A and 14B are cross-sectional views that illustrate a stage in a second example process for forming semiconductor devices that have a conductive bridge between source or drain contacts, in accordance with some embodiments of the present disclosure.
Figure 14B:
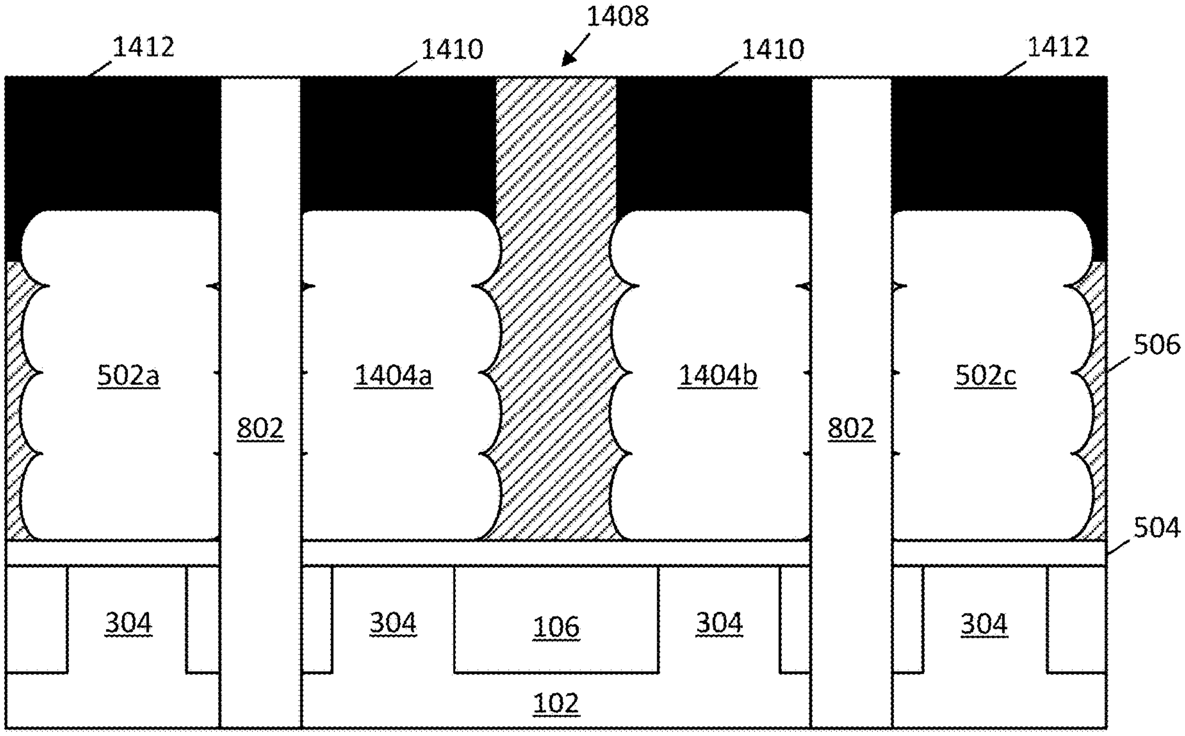

According to some embodiments, FIGS. 14A and 14B illustrate various semiconductor devices, which include two adjacent devices 1401*a* and 1401*b* having nanoribbons 1402 that extend from source or drain regions 1404*a* and 1404*b* respectively. A gate electrode 1406 extends over both nanoribbons 1402 of devices 1401*a* and 1401*b*. While dielectric walls 802 are still used to separate some adjacent devices, no dielectric wall is present between devices 1401*a* and 1401*b*, according to some embodiments.

A dielectric column 1408 may be present between adjacent source or drain regions 1404*a* and 1404*b*, according to some embodiments. Further, dielectric column 1408 may also extend vertically to separate conductive contacts 1410 from each other. Dielectric column 1408 may include any suitable dielectric material, such as silicon dioxide. In some examples, dielectric column 1408 includes the same dielectric material as dielectric fill 506. Dielectric walls 802 may still be used to separate conductive contacts 1410 from other adjacent conductive contacts 1412.

Figure 15A:
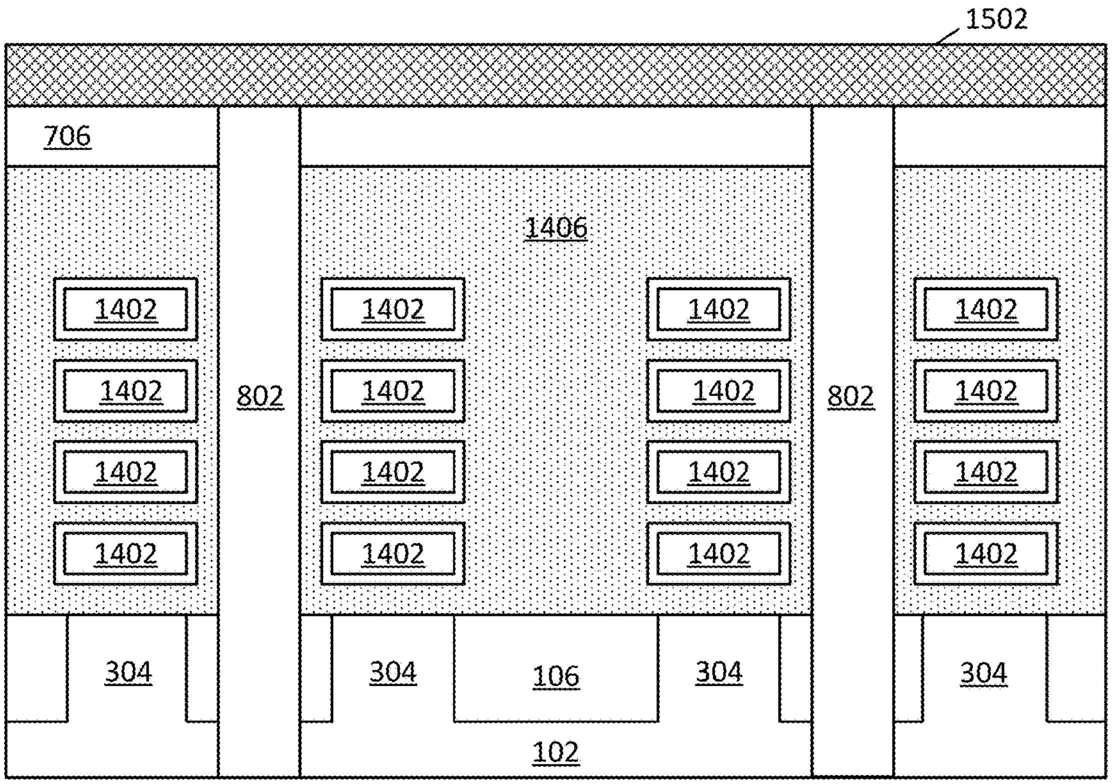
FIGS. 15A and 15B are cross-sectional views that illustrate another stage in the second example process for forming semiconductor devices that have a conductive bridge between source or drain contacts, in accordance with some embodiments of the present disclosure.
Figure 15B:
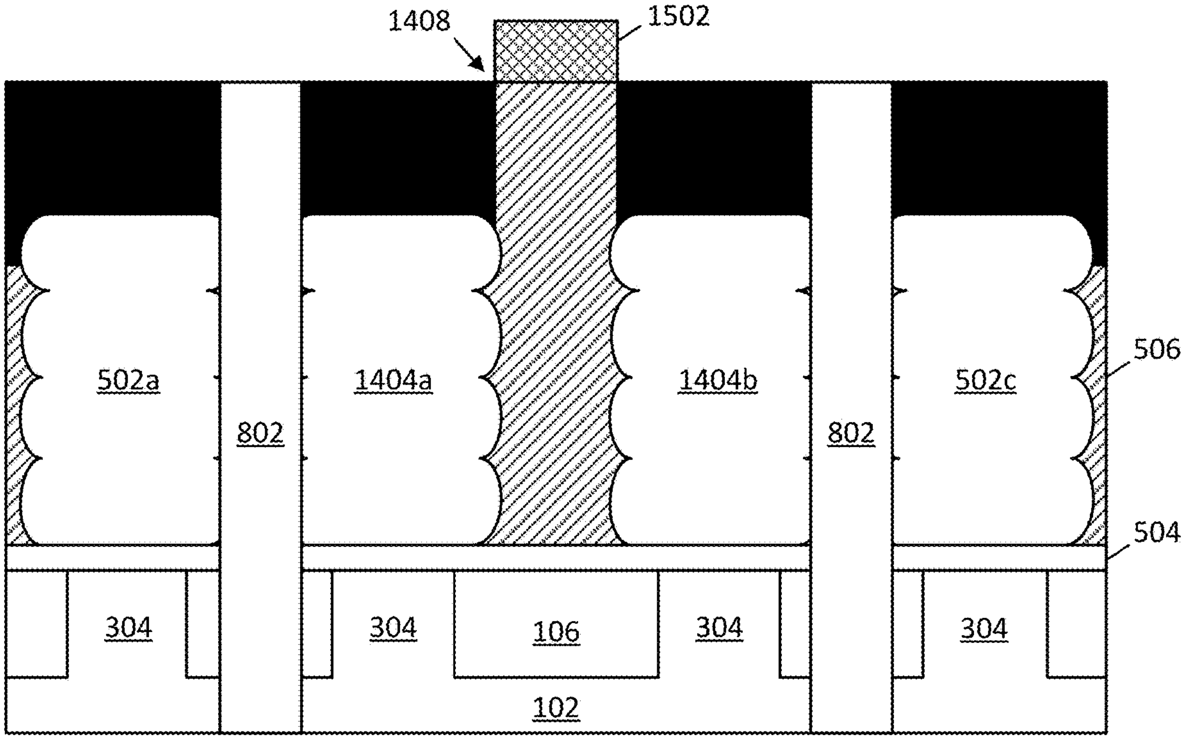

FIGS. 15A and 15B depict the cross-section views of the structure shown in FIGS. 14A and 14B, respectively, following the formation and patterning of a masking layer 1502, according to some embodiments. Any suitable lithography technique may be used with another masking material to remove portions of masking layer 1502 over the source/drain trench. Masking layer 1502 may remain over the entire gate trench. According to some embodiments, masking layer 1502 may be patterned such that is remains over at least a portion of dielectric column 1408 and exposes one or more dielectric walls 802. Masking layer 1502 may be any suitable dielectric material, such as silicon dioxide or silicon nitride.

Figure 16A:
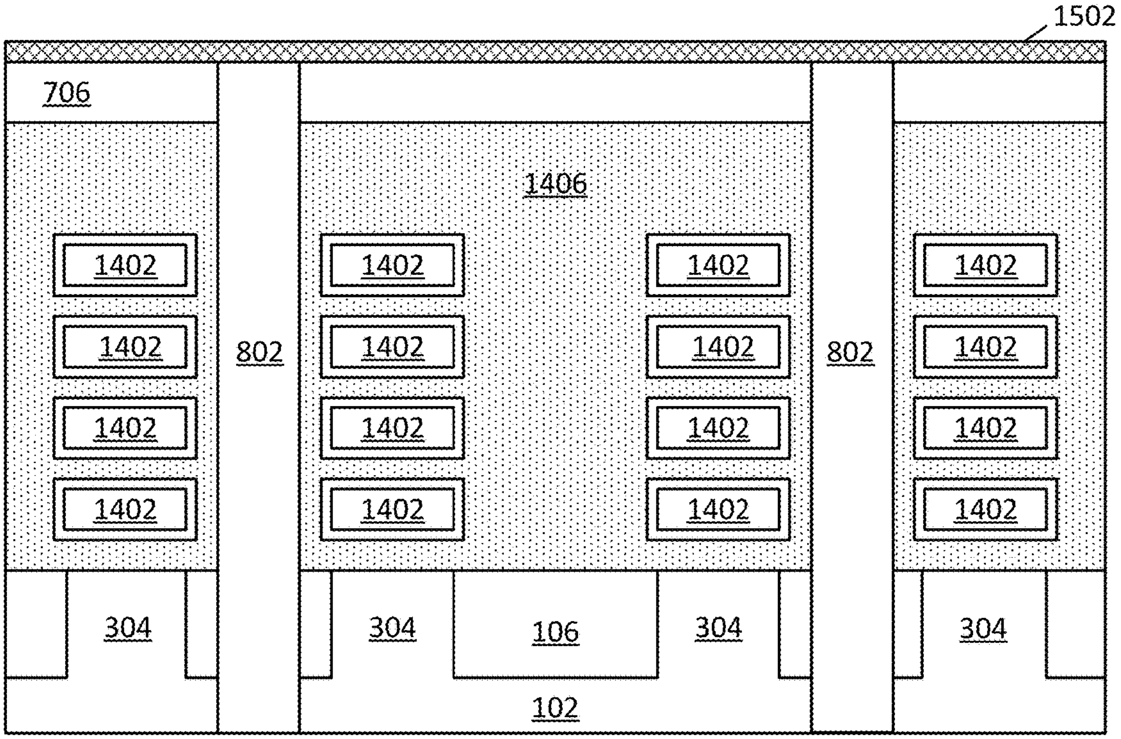
FIGS. 16A and 16B are cross-sectional views that illustrate another stage in the second example process for forming semiconductor devices that have a conductive bridge between source or drain contacts, in accordance with some embodiments of the present disclosure.
Figure 16B:
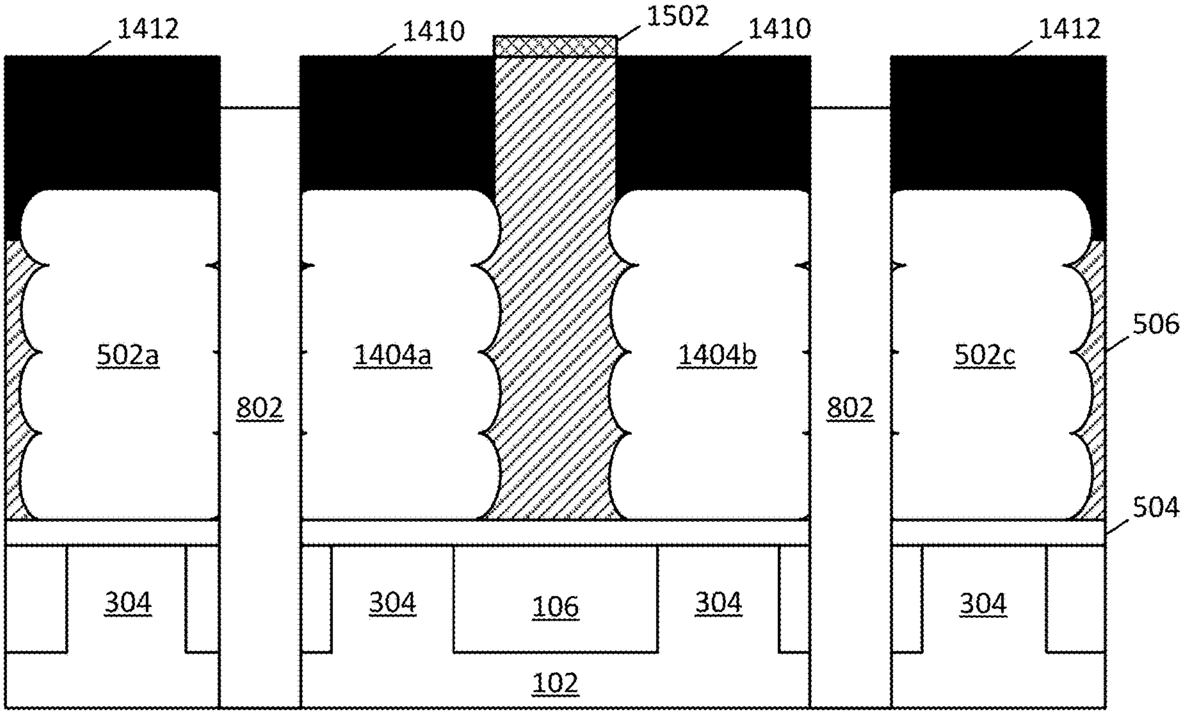

FIGS. 16A and 16B depict the cross-section views of the structure shown in FIGS. 15A and 15B, respectively, following an etching process to recess any dielectric walls 802 not protected by masking layer 1502, according to some embodiments. Masking layer 1502 may be entirely consumed or partially consumed during the etching process that causes the recessing of dielectric wall 802. According to some embodiments, an RIE process may be used to remove a portion of the exposed dielectric wall 802 (e.g., not protected by masking layer 1502). It should be noted that the etching process removes little to none of the exposed metal materials from conductive contacts 1410/1412.

Figure 17A:
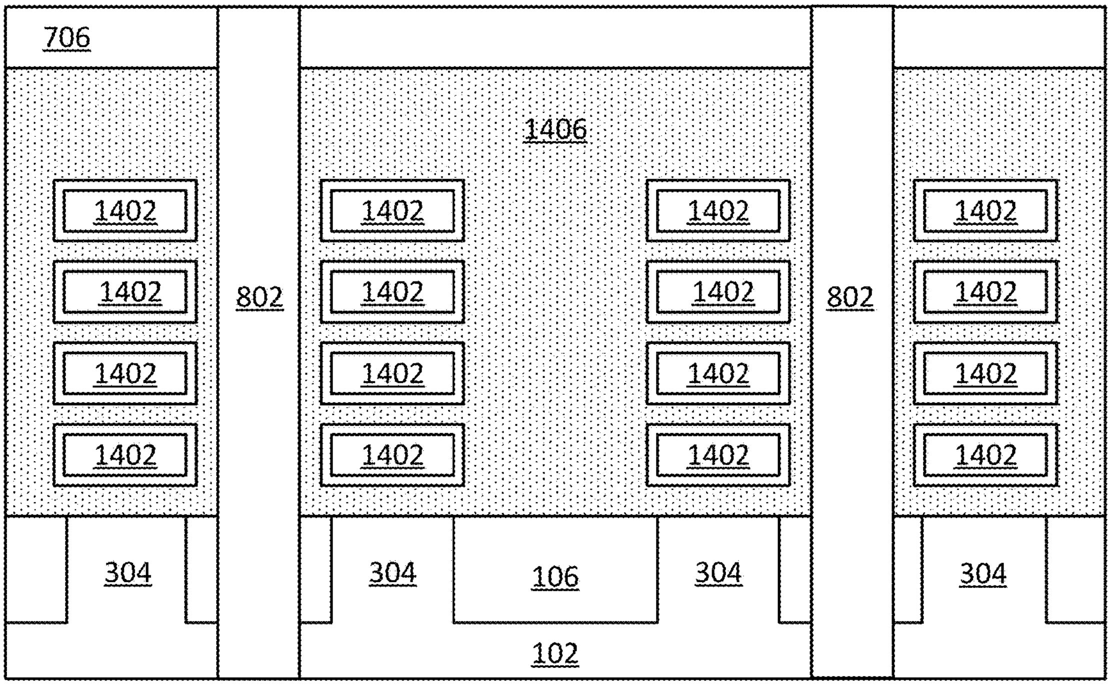
FIGS. 17A and 17B are cross-sectional views that illustrate another stage in the second example process for forming semiconductor devices that have a conductive bridge between source or drain contacts, in accordance with some embodiments of the present disclosure.
Figure 17B:
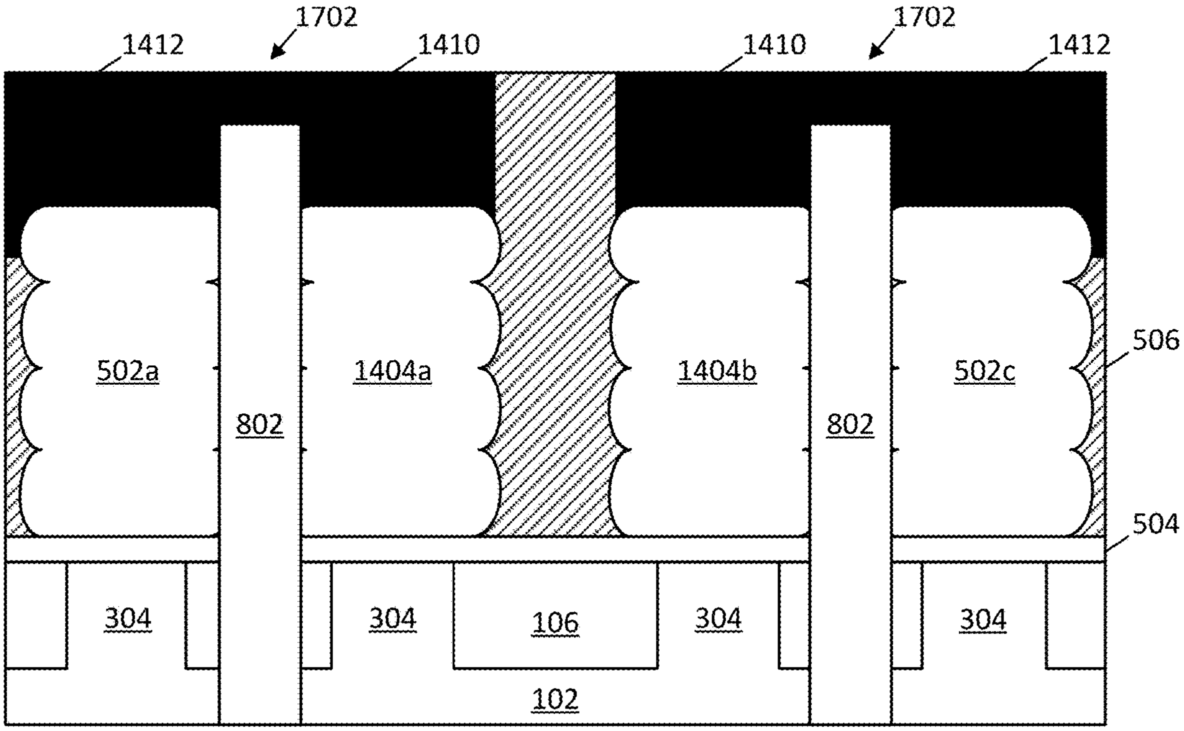

FIGS. 17A and 17B depict the cross-section views of the structure shown in FIGS. 16A and 16B, respectively, following the formation of one or more conductive bridges 1702 within the recessed portions of dielectric walls 802 and the subsequent removal of masking layer 1502, according to some embodiments. Conductive bridges 1702 extend through an upper portion of dielectric walls 802 to contact one conductive contact 1410 and an adjacent conductive contact 1412 on either side of dielectric wall 802. In some examples, conductive bridges 1702 include the same conductive material as conductive contacts 1410/1412. In other examples, the conductive material of conductive bridges 1702 is different from the conductive material of conductive contacts 1410/1412. In some examples, new conductive contacts may be formed at the same time as conductive bridges 1702 such that no seams or grain boundaries are present between the conductive elements. A polishing procedure using, for example, CMP may be used to planarize a top surface of conductive bridges 1702 such that they are substantially coplanar with a top surface of conductive contacts 1410/1412. Conductive bridge 1702 forms a conductive link between the adjacent conductive contacts 1410 and 1412 within the device layer below any frontside interconnect layers, according to some embodiments.

Figure 18:
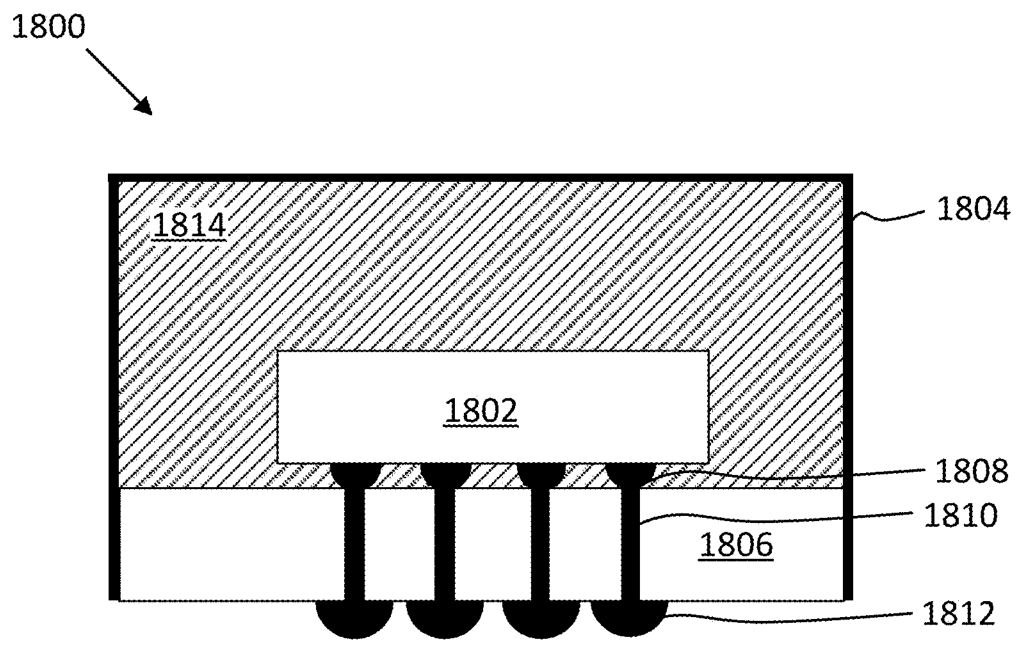
FIG. 18 illustrates a cross-sectional view of a chip package containing one or more semiconductor dies, in accordance with some embodiments of the present disclosure.

FIG. 18 illustrates an example embodiment of a chip package 1800, in accordance with an embodiment of the present disclosure. As can be seen, chip package 1800 includes one or more dies 1802. One or more dies 1802 may include at least one integrated circuit having semiconductor devices, such as any of the semiconductor devices disclosed herein. One or more dies 1802 may include any other circuitry used to interface with other devices formed on the dies, or other devices connected to chip package 1800, in some example configurations.

As can be further seen, chip package 1800 includes a housing 1804 that is bonded to a package substrate 1806. The housing 1804 may be any housing, and may provide, for example, electromagnetic shielding and environmental protection for the components of chip package 1800. The one or more dies 1802 may be conductively coupled to a package substrate 1806 using connections 1808, which may be implemented with any number of connection mechanisms, such as solder bumps, ball grid array (BGA), pins, or wire bonds, to name a few examples. Package substrate 1806 may be any package substrate, but in some cases includes a dielectric material having conductive pathways (e.g., including conductive vias and lines) extending through the dielectric material between the faces of package substrate 1806, or between different locations on each face. In some embodiments, package substrate 1806 may have a thickness less than 1 millimeter (e.g., between 0.1 millimeters and 0.5 millimeters), although any number of package geometries can be used. Additional conductive contacts 1812 may be disposed at an opposite face of package substrate 1806 for conductively contacting, for instance, a printed circuit board (PCB). One or more vias 1810 extend through a thickness of package substrate 1806 to provide conductive pathways between one or more of connections 1808 to one or more of contacts 1812. Vias 1810 are illustrated as single straight columns through package substrate 1806 for ease of illustration, although other configurations can be used (e.g., damascene, dual damascene, through-silicon via, or an interconnect feature that meanders through the thickness of substrate 1806 to contact one or more intermediate locations therein). In still other embodiments, vias 1810 are fabricated by multiple smaller stacked vias, or are staggered at different locations across package substrate 1806. In the illustrated embodiment, contacts 1812 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 1812, to inhibit shorting.

In some embodiments, a mold material 1814 may be disposed around the one or more dies 1802 included within housing 1804 (e.g., between dies 1802 and package substrate 1806 as an underfill material, as well as between dies 1802 and housing 1804 as an overfill material). Although the dimensions and qualities of the mold material 1814 can vary from one embodiment to the next, in some embodiments, a thickness of mold material 1814 is less than 1 millimeter. Example materials that may be used for mold material 1814 include epoxy mold materials, as suitable. In some cases, the mold material 1814 is thermally conductive, in addition to being electrically insulating.

Methodology

Figure 19:
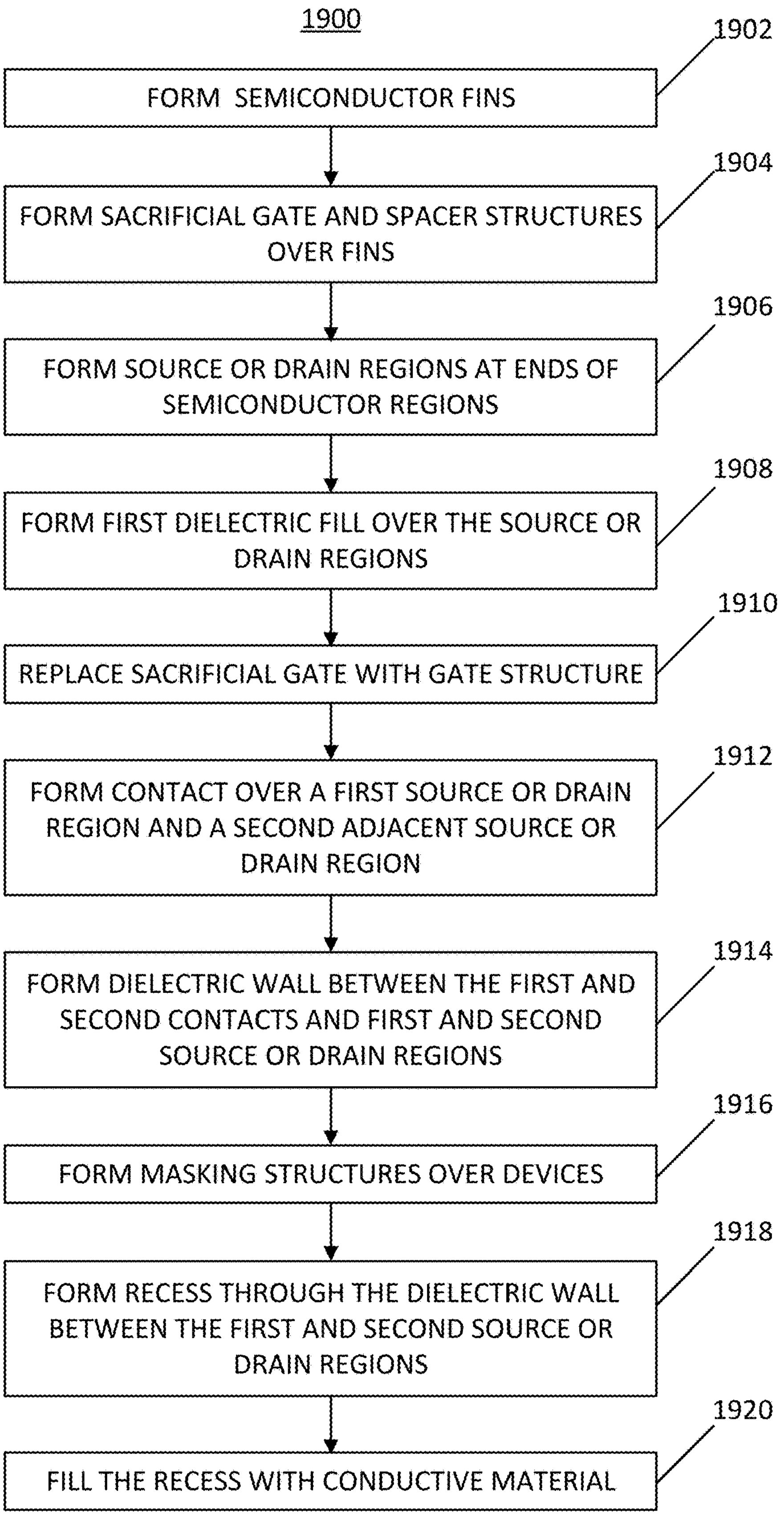
FIG. 19 is a flowchart of a fabrication process for semiconductor devices having a conductive bridge between source or drain contacts, in accordance with an embodiment of the present disclosure.

FIG. 19 is a flow chart of a method 1900 for forming at least a portion of an integrated circuit, according to an embodiment. Various operations of method 1900 may be illustrated in FIGS. 2A-13A and FIGS. 2B-13B or in FIGS. 14A-17A and FIGS. 14B-17B. However, the correlation of the various operations of method 1900 to the specific components illustrated in the aforementioned figures is not intended to imply any structural and/or use limitations. Rather, the aforementioned figures provide example embodiments of method 1900. Other operations may be performed before, during, or after any of the operations of method 1900. For example, method 1900 does not explicitly describe all processes that are performed to form common transistor structures. Some of the operations of method 1900 may be performed in a different order than the illustrated order.

Method 1900 begins with operation 1902 where any number of parallel semiconductor fins are formed, according to some embodiments. The semiconductor material in the fins may be formed from a substrate such that the fins are an integral part of the substrate (e.g., etched from a bulk silicon substrate). Alternatively, the fins can be formed of material deposited onto an underlying substrate. In one such example case, a blanket layer of silicon germanium (SiGe) can be deposited onto a silicon substrate, and then patterned and etched to form a plurality of SiGe fins extending from that substrate. In another such example, the fins include alternating layers of material (e.g., alternating layers of silicon and SiGe) that facilitates forming of nanowires and nanoribbons during a gate forming process where one type of the alternating layers are selectively etched away so as to liberate the other type of alternating layers within the channel region, so that a gate-all-around (GAA) process can then be carried out. The alternating layers can be blanket deposited and then etched into fins, or deposited into fin-shaped trenches. The fins may also include a cap structure over each fin that is used to define the locations of the fins during, for example, an RIE process. The cap structure may be a dielectric material, such as silicon nitride.

According to some embodiments, a dielectric layer is formed around subfin portions of the one or more fins. In some embodiments, the dielectric layer extends between each pair of adjacent parallel fins and runs lengthwise in the same direction as the fins. In some embodiments, the anisotropic etching process that forms the fins also etches into a portion of the substrate and the dielectric layer may be formed within the recessed portions of the substrate. Accordingly, the dielectric layer acts as shallow trench isolation (STI) between adjacent fins. The dielectric layer may be any suitable dielectric material, such as silicon dioxide.

Method 1900 continues with operation 1904 where a sacrificial gate and spacer structures are formed over the fins. The sacrificial gate may be patterned using a gate masking layer in a strip that runs orthogonally over the fins (many gate masking layers and corresponding sacrificial gates may be formed parallel to one another (e.g., forming a cross-hatch pattern with the fins). The gate masking layer may be any suitable hard mask material, such as CHM or silicon nitride. The sacrificial gate may be formed from any suitable material that can be selectively removed at a later time without damaging the semiconductor material of the fins. In one example, the sacrificial gate includes polysilicon. The spacer structures may be deposited and then etched back such that the spacer structures remain mostly only on sidewalls of any exposed structures. According to some embodiments, the spacer structures may be any suitable dielectric material, such as silicon nitride or silicon oxynitride.

Method 1900 continues with operation 1906 where source or drain regions are formed at the ends of the semiconductor regions of each of the fins. Any portions of the fins not protected by the sacrificial gate and spacer structures may be removed using, for example, an anisotropic etching process followed by the epitaxial growth of the source or drain regions from the exposed ends of the semiconductor layers in the fins. In some example embodiments, the source or drain regions are NMOS source or drain regions (e.g., epitaxial silicon) or PMOS source or drain regions (e.g., epitaxial SiGe).

Method 1900 continues with operation 1908 where a first dielectric fill is formed over the source or drain regions. The first dielectric fill may be formed adjacent to the various source or drain regions for additional electrical isolation between adjacent regions. The first dielectric fill may also extend over a top surface of the source or drain regions. The first dielectric fill can take up any remaining space along the source/drain trench, according to some embodiments. The first dielectric fill may include any suitable dielectric material, such as silicon dioxide or silicon oxynitride.

Method 1900 continues with operation 1910 where the sacrificial gate is replaced with a gate structure. According to some embodiments, the sacrificial gate may be removed along with any sacrificial layers within the exposed fins between the spacer structures (in the case of GAA structures). A gate structure may then be formed in place of the sacrificial gate. The gate structure may include both a gate dielectric and a gate electrode. The gate dielectric is first formed over the exposed semiconductor regions between the spacer structures followed by forming the gate electrode within the remainder of the trench between the spacer structures, according to some embodiments. The gate dielectric may include any number of dielectric layers deposited using a CVD process, such as ALD. The gate electrode can include any conductive material, such as a metal, metal alloy, or polysilicon. The gate electrode may be deposited using electroplating, electroless plating, CVD, ALD, PECVD, or PVD, to name a few examples.

Method 1900 continues with operation 1912 where a contact is formed over a first source or drain region and a second adjacent source or drain region. In some embodiments, a conductive layer forms the contact over both the first and second source or drain regions within the source/drain trench. The conductive layer may include any suitable conductive material, such as tungsten, molybdenum, ruthenium, or cobalt. The conductive layer represents any number of different conductive materials that may be deposited to form the contact and may extend over the top surfaces of any number of source or drain regions within the source/drain trench.

Method 1900 continues with operation 1914 where a dielectric wall is formed through the gate structure between adjacent pairs of fins and through the source/drain trench between the first source or drain region and the second source or drain region. According to some embodiments, the dielectric wall also cuts through the conductive layer to isolate separate conductive contacts on each of the first source or drain region and the second source or drain region. A trench may be etched through both the gate structure and through the dielectric fill around the source or drain regions. The trench may extend substantially parallel and lengthwise to the fins or nanowires. A single etching process may be used to form multiple trenches between adjacent devices using a mask with a grating pattern. A reactive ion etching (RIE) process may be used to cut through the various material layers and form the trenches. The trench may be filled with a dielectric material to form the dielectric wall between the first source or drain region and the second source or drain region. The trench may be filled with any suitable low-K dielectric material, such as silicon nitride. In some embodiments, each pair of semiconductor devices in the integrated circuit includes a dielectric wall between them.

Method 1900 continues with operation 1916 where various masking structures are formed over the semiconductor devices. According to some embodiments, a first masking layer protects the gate trench and is recessed over the source/drain trench such that a thinner portion of the first masking layer is left over the source/drain trench compared to what is over the gate trench. A second masking layer may be formed over the top surfaces of the first masking layer over the gate trench to protect that portion of the first masking layer during subsequent etching processes. A blocking layer may be deposited and lithographically patterned over certain dielectric walls to protect those walls from being recessed. Any dielectric walls that do not include a blocking layer over them will be exposed to later etching processes. The first masking layer and the blocking layer may be any suitable dielectric material, such as silicon dioxide, silicon nitride, or silicon oxynitride. The second masking layer may include a metal, such as titanium nitride.

Method 1900 continues with operation 1918 where a recess is formed through a portion of the dielectric wall between the first and second source or drain regions. An RIE process may be used to remove exposed portions of the first masking layer as well as portions of the dielectric wall not protected by the blocking layer. The blocking layer may be entirely consumed during the etching process that causes the recessing of the dielectric wall. In some examples, some portions of the blocking layer may remain over remaining portions of the first masking layer. It should be noted that the etching process removes little to none of the exposed metal materials from the conductive contacts and little to none of the second masking layer, according to some embodiments.

Method 1900 continues with operation 1920 wherein a conductive material is formed within the recess. The conductive material may be tungsten or any other suitable metal, such as ruthenium, cobalt, titanium, molybdenum, or any alloys thereof. According to some embodiments, a top surface of the conductive material is polished using, for example, CMP until it is substantially coplanar with a top surface of the adjacent conductive contacts in the source/drain trench.

Example System

Figure 20:
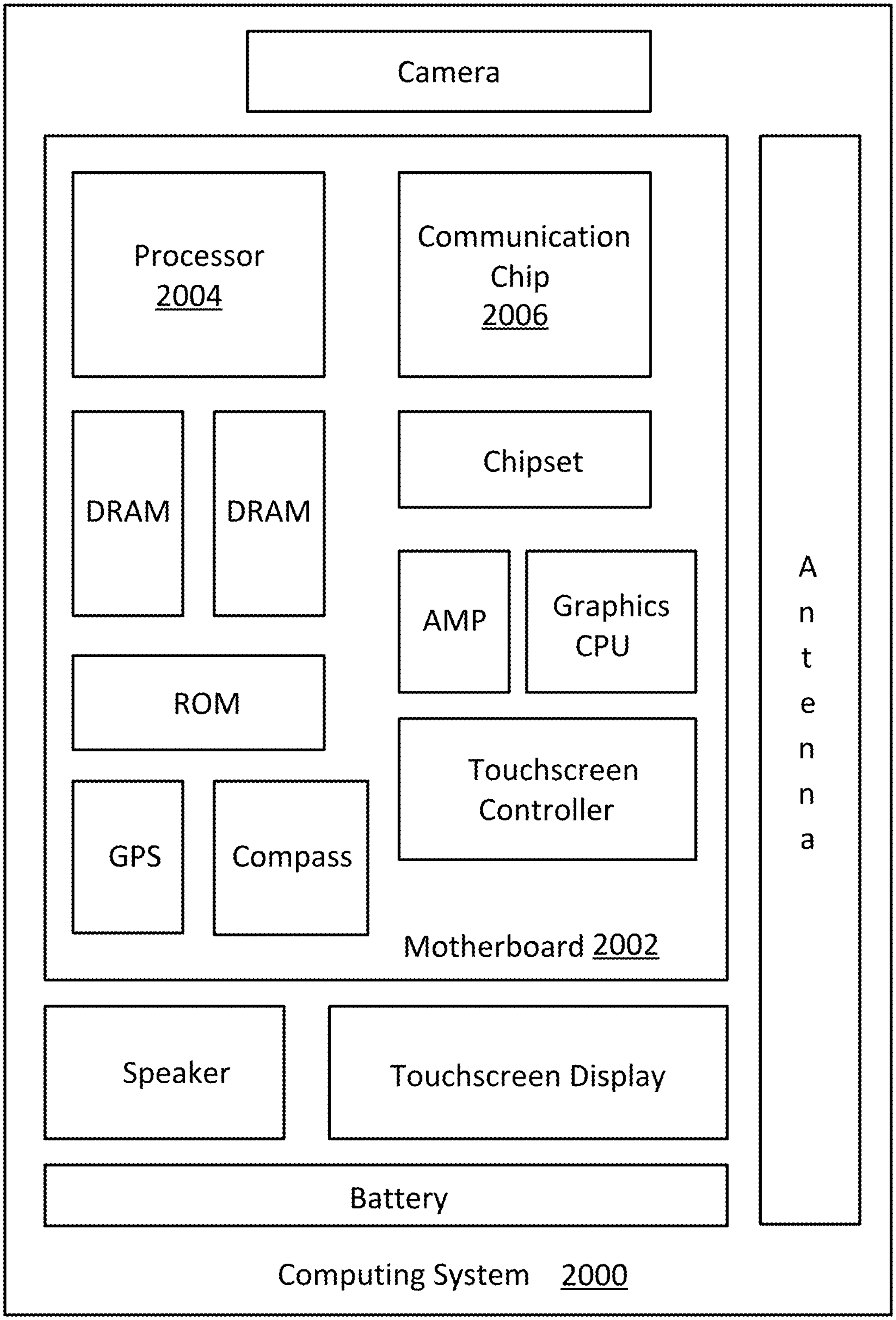
FIG. 20 illustrates a computing system including one or more integrated circuits, as variously described herein, in accordance with an embodiment of the present disclosure.

FIG. 20 is an example computing system implemented with one or more of the integrated circuit structures as disclosed herein, in accordance with some embodiments of the present disclosure. As can be seen, the computing system 2000 houses a motherboard 2002. The motherboard 2002 may include a number of components, including, but not limited to, a processor 2004 and at least one communication chip 2006, each of which can be physically and electrically coupled to the motherboard 2002, or otherwise integrated therein. As will be appreciated, the motherboard 2002 may be, for example, any printed circuit board (PCB), whether a main board, a daughterboard mounted on a main board, or the only board of system 2000, etc.

Depending on its applications, computing system 2000 may include one or more other components that may or may not be physically and electrically coupled to the motherboard 2002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 2000 may include one or more integrated circuit structures or devices configured in accordance with an example embodiment (e.g., a module including an integrated circuit on a substrate, the substrate having semiconductor devices that include a conductive bridge between source or drain contacts). In some embodiments, multiple functions can be integrated into one or more chips (e.g., for instance, note that the communication chip 2006 can be part of or otherwise integrated into the processor 2004).

The communication chip 2006 enables wireless communications for the transfer of data to and from the computing system 2000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 2006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 2000 may include a plurality of communication chips 2006. For instance, a first communication chip 2006 may be dedicated to shorter range wireless communications such as Wi-Fi and Bluetooth and a second communication chip 2006 may be dedicated to longer range wireless communications such as GPS, EDGE, GPRS, CDMA, WiMAX, LTE, Ev-DO, and others.

The processor 2004 of the computing system 2000 includes an integrated circuit die packaged within the processor 2004. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 2006 also may include an integrated circuit die packaged within the communication chip 2006. In accordance with some such example embodiments, the integrated circuit die of the communication chip includes one or more semiconductor devices as variously described herein. As will be appreciated in light of this disclosure, note that multi-standard wireless capability may be integrated directly into the processor 2004 (e.g., where functionality of any chips 2006 is integrated into processor 2004, rather than having separate communication chips). Further note that processor 2004 may be a chip set having such wireless capability. In short, any number of processor 2004 and/or communication chips 2006 can be used. Likewise, any one chip or chip set can have multiple functions integrated therein.

In various implementations, the computing system 2000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 2000 may be combined or integrated in a system-on-a-chip (SoC) architecture. In some embodiments, the components may be hardware components, firmware components, software components or any suitable combination of hardware, firmware or software.

Further Example Embodiments

The following examples pertain to further embodiments, from which numerous permutations and configurations will be apparent.

Example 1 is an integrated circuit that includes a first semiconductor region extending in a first direction from a first source or drain region, a second semiconductor region extending in the first direction from a second source or drain region with the second source or drain region spaced from the first source or drain region in a second direction different from the first direction, a first gate electrode around the first semiconductor region and a second gate electrode around the second semiconductor region, a dielectric wall between the first semiconductor region and the second semiconductor region and extending in the first direction such that the dielectric wall extends between the first gate electrode and the second gate electrode and the dielectric wall extends between the first source or drain region and the second source or drain region, a first contact on a top surface of the first source or drain region and a second contact on a top surface of the second source or drain region, and a conductive bridge between the first contact and the second contact. The conductive bridge extends through a portion of the dielectric wall to contact sides of the first contact and the second contact.

Example 2 includes the integrated circuit of Example 1, wherein the dielectric wall comprises a dielectric layer along one or more edges of the dielectric wall and a dielectric fill in a remaining volume of the dielectric wall.

Example 3 includes the integrated circuit of Example 2, wherein the dielectric layer comprises a low-K dielectric material.

Example 4 includes the integrated circuit of any one of Examples 1-3, wherein the first semiconductor region comprises a plurality of first semiconductor nanoribbons and the second semiconductor region comprises a plurality of second semiconductor nanoribbons.

Example 5 includes the integrated circuit of Example 4, wherein the plurality of first semiconductor nanoribbons and the plurality of second semiconductor nanoribbons comprise germanium, silicon, or a combination thereof.

Example 6 includes the integrated circuit of any one of Examples 1-5, further comprising a gate dielectric layer around the first semiconductor region and the second semiconductor region, such that the gate dielectric layer is between the first semiconductor region and the first gate electrode and is between the second semiconductor region and the second gate electrode.

Example 7 includes the integrated circuit of Example 6, wherein the gate dielectric layer is not present on any sidewall of the dielectric wall.

Example 8 includes the integrated circuit of any one of Examples 1-7, wherein the conductive bridge comprises a same conductive material as both the first contact and the second contact.

Example 9 includes the integrated circuit of any one of Examples 1-8, wherein a top surface of the conductive bridge is substantially coplanar with a top surface of both the first contact and the second contact.

Example 10 includes the integrated circuit of any one of Examples 1-9, wherein a first portion of the dielectric wall extending between the first gate electrode and the second gate electrode has a first height, and a second portion of the dielectric wall extending between the first source or drain region and the second source or drain region has a second height. The second height is shorter than the first height by 4 nm or more.

Example 11 includes the integrated circuit of any one of Examples 1-10, wherein the dielectric wall is a first dielectric wall and the integrated circuit further comprises a second dielectric wall between the first contact and a third contact on the top surface of a third source or drain region, the second dielectric wall extending vertically along an entire height of both the first contact and the third contact, and a third dielectric wall between the second contact and a fourth contact on the top surface of a fourth source or drain region, the third dielectric wall extending vertically along an entire height of both the second contact and the fourth contact.

Example 12 is a printed circuit board comprising the integrated circuit of any one of Examples 1-11.

Example 13 is an electronic device that includes a chip package comprising one or more dies. At least one of the one or more dies includes a first semiconductor device having a first semiconductor region extending in a first direction from a first source or drain region and a first gate electrode around the first semiconductor region, and a second semiconductor device having a second semiconductor region extending in the first direction from a second source or drain region and a second gate electrode around the second semiconductor region. The second source or drain region is spaced from the first source or drain region in a second direction different from the first direction. The at least one of the one or more dies also includes a dielectric wall between the first semiconductor device and the second semiconductor device and extending in the first direction such that the dielectric wall extends at least between the first source or drain region and the second source or drain region, a first contact on a top surface of the first source or drain region and a second contact on a top surface of the second source or drain region, and a conductive bridge between the first contact and the second contact. The conductive bridge extends through a portion of the dielectric wall to contact opposing sides of the first contact and the second contact.

Example 14 includes the electronic device of Example 13, wherein the dielectric wall comprises a dielectric layer along one or more edges of the dielectric wall and a dielectric fill in a remaining volume of the dielectric wall.

Example 15 includes the electronic device of Example 14, wherein the dielectric layer comprises a low-K dielectric material.

Example 16 includes the electronic device of any one of Examples 13-15, wherein the first semiconductor region comprises a plurality of first semiconductor nanoribbons and the second semiconductor region comprises a plurality of second semiconductor nanoribbons.

Example 17 includes the electronic device of Example 16, wherein the plurality of first semiconductor nanoribbons and the plurality of second semiconductor nanoribbons comprise germanium, silicon, or a combination thereof.

Example 18 includes the electronic device of any one of Examples 13-17, wherein the at least one of the one or more dies further comprises a gate dielectric layer around the first semiconductor region and the second semiconductor region, such that the gate dielectric layer is between the first semiconductor region and the first gate electrode and is between the second semiconductor region and the second gate electrode.

Example 19 includes the electronic device of Example 18, wherein the gate dielectric layer is not present on any sidewall of the dielectric wall.

Example 20 includes the electronic device of any one of Examples 13-19, wherein the conductive bridge comprises a same conductive material as both the first contact and the second contact.

Example 21 includes the electronic device of any one of Examples 13-20, wherein a top surface of the conductive bridge is substantially coplanar with a top surface of both the first contact and the second contact.

Example 22 includes the electronic device of any one of Examples 13-21, wherein the dielectric wall is a first dielectric wall and the at least one of the one or more dies further comprises a second dielectric wall between the first contact and a third contact on the top surface of a third source or drain region, the second dielectric wall extending vertically along an entire height of both the first contact and the third contact, and a third dielectric wall between the second contact and a fourth contact on the top surface of a fourth source or drain region, the third dielectric wall extending vertically along an entire height of both the second contact and the fourth contact.

Example 23 includes the electronic device of any one of Examples 13-22, further comprising a printed circuit board, wherein the chip package is coupled to the printed circuit board.

Example 24 is a method of forming an integrated circuit. The method includes forming a first fin comprising first semiconductor material and a second fin comprising second semiconductor material, the first and second fins extending above a substrate and each extending in a first direction; forming a gate electrode extending over the first fin and the second fin in a second direction different from the first direction; forming a first source or drain region at a first end of the first fin; forming a second source or drain region at a first end of the second fin; forming a contact over the first source or drain region and the second source or drain region; forming a recess through the gate electrode between the first fin and the second fin, the recess further extending in the first direction between the first source or drain region and the second source or drain region, wherein the recess splits the contact into a first contact and a second contact; forming a dielectric material within the recess; recessing a portion of the dielectric material between the first contact and the second contact; and forming a conductive material over the dielectric material, the conductive material being within the recess and contacting both the first contact and the second contact.

Example 25 includes the method of Example 24, further comprising forming a gate dielectric layer around the first semiconductor material and the second semiconductor material before forming the gate electrode.

Example 26 includes the method of Example 24 or 25, wherein forming the recess comprises forming the recess through an entire thickness of the gate electrode.

Example 27 includes the method of any one of Examples 24-26, wherein forming the dielectric material within the recess forms a dielectric wall, the method further comprising forming mask structures to protect other dielectric walls while recessing a portion of the dielectric wall.

Example 28 is an integrated circuit that includes a first semiconductor region extending in a first direction from a first source or drain region, a second semiconductor region extending in the first direction from a second source or drain region with the second source or drain region spaced from the first source or drain region in a second direction different from the first direction, a first gate electrode around the first semiconductor region and a second gate electrode around the second semiconductor region, a dielectric wall between the first semiconductor region and the second semiconductor region and extending in the first direction such that the dielectric wall extends between an entire thickness of the first gate electrode and the second gate electrode and extends between an entire thickness of the first source or drain region and the second source or drain region, and a conductive contact over a top surface of the first source or drain region and the second source or drain region. A portion of the conductive contact extends through a portion of the dielectric wall in the second direction.

Example 29 includes the integrated circuit of Example 28, wherein the dielectric wall comprises a dielectric layer along one or more edges of the dielectric wall and a dielectric fill in a remaining volume of the dielectric wall.

Example 30 includes the integrated circuit of Example 29, wherein the dielectric layer comprises a low-K dielectric material.

Example 31 includes the integrated circuit of any one of Examples 28-30, wherein the first semiconductor region comprises a plurality of first semiconductor nanoribbons and the second semiconductor region comprises a plurality of second semiconductor nanoribbons.

Example 32 includes the integrated circuit of Example 31, wherein the plurality of first semiconductor nanoribbons and the plurality of second semiconductor nanoribbons comprise germanium, silicon, or a combination thereof.

Example 33 includes the integrated circuit of any one of Examples 28-32, further comprising a gate dielectric layer around the first semiconductor region and the second semiconductor region, such that the gate dielectric layer is between the first semiconductor region and the first gate electrode and is between the second semiconductor region and the second gate electrode.

Example 34 includes the integrated circuit of Example 33, wherein the gate dielectric layer is not present on any sidewall of the dielectric wall.

Example 35 includes the integrated circuit of any one of Examples 28-34, wherein a top surface of the entire conductive contact is substantially coplanar with a top surface of the dielectric wall.

Example 36 includes the integrated circuit of any one of Examples 28-35, wherein the dielectric wall is a first dielectric wall, the conductive contact is a first conductive contact, and the integrated circuit further comprises a second dielectric wall between the first conductive contact and a second conductive contact on the top surface of a third source or drain region, the second dielectric wall extending vertically along an entire height of both the first conductive contact and the second conductive contact, and a third dielectric wall between the first conductive contact and a third conductive contact on the top surface of a fourth source or drain region, the third dielectric wall extending vertically along an entire height of both the first conductive contact and the third conductive contact.

Example 37 is a printed circuit board comprising the integrated circuit of any one of Examples 28-36.

Example 38 is an integrated circuit that includes a first source or drain region, a second source or drain region, a first dielectric wall extending laterally between the first source or drain region and the second source or drain region, a second dielectric wall extending adjacent to the first source or drain region, such that the first source or drain region is laterally between the first and second dielectric walls, a third dielectric wall extending adjacent to the second source or drain region, such that the second source or drain region is laterally between the first and third dielectric walls, and a conductive structure laterally extending between the second and third dielectric walls and over the first dielectric wall. The conductive structure contacts a portion of a sidewall of the second dielectric wall and a portion of a sidewall of the third dielectric wall.

Example 39 includes the integrated circuit of Example 38, wherein the conductive structure includes a first contact portion on the first source or drain region, a second contact portion on the second source or drain region, and a bridging portion that couples the first and second contact portions.

Example 40 includes the integrated circuit of Example 39, wherein the first contact portion, the second contact portion, and the bridging portion form a continuous and monolithic conductive structure.

Example 41 includes the integrated circuit of any one of Examples 38-40, comprising an interconnect structure above the first and second source or drain regions, and above the first, second, and third dielectric walls, and above the conductive structure, the interconnect structure including one or more interconnect layers, each interconnect layer including one or more conductive interconnect features in dielectric material.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit comprising:

a first semiconductor region extending in a first direction from a first source or drain region;

a second semiconductor region extending in the first direction from a second source or drain region, the second source or drain region spaced from the first source or drain region in a second direction different from the first direction;

a first gate electrode around the first semiconductor region and a second gate electrode around the second semiconductor region;

a dielectric wall between the first semiconductor region and the second semiconductor region and extending in the first direction such that the dielectric wall extends between the first gate electrode and the second gate electrode and the dielectric wall extends between the first source or drain region and the second source or drain region;

a first contact on a top surface of the first source or drain region and a second contact on a top surface of the second source or drain region; and a conductive bridge between the first contact and the second contact, wherein the conductive bridge extends through a portion of the dielectric wall to contact sides of the first contact and the second contact.

2. The integrated circuit of claim 1, wherein the dielectric wall comprises a dielectric layer along one or more edges of the dielectric wall and a dielectric fill in a remaining volume of the dielectric wall.

3. The integrated circuit of claim 1, wherein the first semiconductor region comprises a plurality of first semiconductor nanoribbons and the second semiconductor region comprises a plurality of second semiconductor nanoribbons.

4. The integrated circuit of claim 1, further comprising a gate dielectric layer around the first semiconductor region and the second semiconductor region, such that the gate dielectric layer is between the first semiconductor region and the first gate electrode and is between the second semiconductor region and the second gate electrode.

5. The integrated circuit of claim 4, wherein the gate dielectric layer is not present on any sidewall of the dielectric wall.

6. The integrated circuit of claim 1, wherein a top surface of the conductive bridge is substantially coplanar with a top surface of both the first contact and the second contact.

7. The integrated circuit of claim 1, wherein a first portion of the dielectric wall extending between the first gate electrode and the second gate electrode has a first height, and a second portion of the dielectric wall extending between the first source or drain region and the second source or drain region has a second height, the second height being shorter than the first height by 4 nm or more.

8. A printed circuit board comprising the integrated circuit of claim 1.

9. An integrated circuit comprising:

a first semiconductor region extending in a first direction from a first source or drain region;

a second semiconductor region extending in the first direction from a second source or drain region, the second source or drain region spaced from the first source or drain region in a second direction different from the first direction;

a first gate electrode around the first semiconductor region and a second gate electrode around the second semiconductor region;

a dielectric wall between the first semiconductor region and the second semiconductor region and extending in the first direction such that the dielectric wall extends between an entire thickness of the first gate electrode and the second gate electrode and extends between an entire thickness of the first source or drain region and the second source or drain region; and a conductive contact over a top surface of the first source or drain region and the second source or drain region, wherein a portion of the conductive contact extends through a portion of the dielectric wall in the second direction.

10. The integrated circuit of claim 9, wherein the dielectric wall comprises a dielectric layer along one or more edges of the dielectric wall and a dielectric fill in a remaining volume of the dielectric wall.

11. The integrated circuit of claim 9, wherein the first semiconductor region comprises a plurality of first semiconductor nanoribbons and the second semiconductor region comprises a plurality of second semiconductor nanoribbons.

12. The integrated circuit of claim 9, further comprising a gate dielectric layer around the first semiconductor region and the second semiconductor region, such that the gate dielectric layer is between the first semiconductor region and the first gate electrode and is between the second semiconductor region and the second gate electrode.

13. The integrated circuit of claim 12, wherein the gate dielectric layer is not present on any sidewall of the dielectric wall.

14. The integrated circuit of claim 9, wherein a top surface of the entire conductive contact is substantially coplanar with a top surface of the dielectric wall.

15. The integrated circuit of claim 9, wherein the dielectric wall is a first dielectric wall, the conductive contact is a first conductive contact, and the integrated circuit further comprises:

a second dielectric wall between the first conductive contact and a second conductive contact on the top surface of a third source or drain region, the second dielectric wall extending vertically along an entire height of both the first conductive contact and the second conductive contact; and a third dielectric wall between the first conductive contact and a third conductive contact on the top surface of a fourth source or drain region, the third dielectric wall extending vertically along an entire height of both the first conductive contact and the third conductive contact.

16. A printed circuit board comprising the integrated circuit of claim 9.

17. An integrated circuit comprising:

a first source or drain region;

a second source or drain region;

a first dielectric wall extending laterally between the first source or drain region and the second source or drain region;

a second dielectric wall extending adjacent to the first source or drain region, such that the first source or drain region is laterally between the first and second dielectric walls;

a third dielectric wall extending adjacent to the second source or drain region, such that the second source or drain region is laterally between the first and third dielectric walls; and a conductive structure laterally extending between the second and third dielectric walls and over the first dielectric wall, wherein the conductive structure contacts a portion of a sidewall of the second dielectric wall and a portion of a sidewall of the third dielectric wall.

18. The integrated circuit of claim 17, wherein the conductive structure includes: a first contact portion on the first source or drain region; a second contact portion on the second source or drain region; and a bridging portion that couples the first and second contact portions.

19. The integrated circuit of claim 18, wherein the first contact portion, the second contact portion, and the bridging portion form a continuous and monolithic conductive structure.

20. The integrated circuit of claim 17, comprising an interconnect structure above the first and second source or drain regions, and above the first, second, and third dielectric walls, and above the conductive structure, the interconnect structure including one or more interconnect layers, each interconnect layer including one or more conductive interconnect features in dielectric material.

* * * * *